US008546896B2

(12) United States Patent
Lottis et al.

(10) Patent No.: US 8,546,896 B2
(45) Date of Patent: Oct. 1, 2013

(54) MAGNETIC TUNNELING JUNCTION ELEMENTS HAVING MAGNETIC SUBSTRUCTURES(S) WITH A PERPENDICULAR ANISOTROPY AND MEMORIES USING SUCH MAGNETIC ELEMENTS

(75) Inventors: Daniel Lottis, Sunnyvale, CA (US); Eugene Youjun Chen, Fremont, CA (US); Xueti Tang, Fremont, CA (US); Steven M. Watts, Mountain View, CA (US)

(73) Assignee: Grandis, Inc., San Jose, CA (US)

( * ) Notice: Subject to any disclaimer, the term of this patent is extended or adjusted under 35 U.S.C. 154(b) by 238 days.

(21) Appl. No.: 12/941,031

(22) Filed: Nov. 6, 2010

(65) Prior Publication Data

US 2012/0012953 A1    Jan. 19, 2012

Related U.S. Application Data

(60) Provisional application No. 61/365,281, filed on Jul. 16, 2010.

(51) Int. Cl.
*H01L 29/82* (2006.01)

(52) U.S. Cl.
USPC .................... 257/421; 257/E29.323

(58) Field of Classification Search
USPC ......................................... 257/421
See application file for complete search history.

(56) References Cited

U.S. PATENT DOCUMENTS

| | | | |
|---|---|---|---|
| 6,020,000 A | 2/2000 | Wong et al. | |
| 6,532,164 B2 | 3/2003 | Redon et al. | |
| 6,611,405 B1 | 8/2003 | Inomata et al. | |
| 6,771,534 B2 | 8/2004 | Stipe | |
| 6,967,863 B2 | 11/2005 | Huai | |
| 7,101,600 B1 | 9/2006 | Kim | |
| 7,106,624 B2 | 9/2006 | Huai et al. | |
| 7,128,987 B2 * | 10/2006 | van de Veerdonk et al. | 428/828 |
| 7,382,643 B2 * | 6/2008 | Ashida et al. | 365/158 |
| 2002/0105827 A1 | 8/2002 | Redon et al. | |
| 2003/0007398 A1 | 1/2003 | Daughton et al. | |
| 2003/0059588 A1 | 3/2003 | Hannah et al. | |
| 2003/0227807 A1 | 12/2003 | Nakamura et al. | |
| 2005/0040433 A1 | 2/2005 | Nozieres et al. | |

(Continued)

OTHER PUBLICATIONS

International Search Report for PCT/US11/43413, dated Dec. 1, 2011, 8 pp.

(Continued)

*Primary Examiner* — Howard Weiss
*Assistant Examiner* — Bilkis Jahan
(74) *Attorney, Agent, or Firm* — Convergent Law Group LLP

(57) ABSTRACT

A method and system for providing a magnetic substructure usable in a magnetic device, as well as a magnetic element and memory using the substructure are described. The magnetic substructure includes a plurality of ferromagnetic layers and a plurality of nonmagnetic layers. The plurality of ferromagnetic layers are interleaved with the plurality of nonmagnetic layers. The plurality of ferromagnetic layers are immiscible with and chemically stable with respect to the plurality of nonmagnetic layers. The plurality of ferromagnetic layers are substantially free of a magnetically dead layer-producing interaction with the plurality of nonmagnetic layers. Further, the plurality of nonmagnetic layers induce a perpendicular anisotropy in the plurality of ferromagnetic layers. The magnetic substructure is configured to be switchable between a plurality of stable magnetic states when a write current is passed through the magnetic substructure.

37 Claims, 8 Drawing Sheets

(56) References Cited

U.S. PATENT DOCUMENTS

| | | | |
|---|---|---|---|
| 2005/0104101 A1 | 5/2005 | Sun et al. | |
| 2005/0174702 A1 | 8/2005 | Gill | |
| 2005/0184839 A1* | 8/2005 | Nguyen et al. | 335/173 |
| 2005/0189574 A1 | 9/2005 | Nguyen et al. | |
| 2008/0144233 A1* | 6/2008 | Amano et al. | 360/324.2 |
| 2009/0285017 A1* | 11/2009 | Yamane et al. | 365/171 |
| 2010/0090301 A1 | 4/2010 | Lou et al. | |
| 2010/0124106 A1 | 5/2010 | Kim et al. | |
| 2010/0148167 A1 | 6/2010 | Whig et al. | |
| 2011/0096443 A1 | 4/2011 | Zhang et al. | |

OTHER PUBLICATIONS

International Preliminary Examination Report issued Jan. 31, 2013 for International Patent Application Ser. No. PCT/US2011/043413.

Japanese abstract of publication No. 11-120758, Apr. 30, 1999, Non-volatile Random Access Memory, Eric Maiken.

Albert, et al., "Polarized Current Switching of a CO Thin Film Nanomagnet", American Institute of Physics, 77(23):3809-11 (2000).

Berger, "Emission of spin waves by a magnetic multilayer traversed by a current", Physical Review B, 54(13)9953-58 (1996).

Ikeda, et al., "A perpendicular anisotrophy CoFeB-MgO magnetic tunnel junction", Nature Materials Online Jul. 11, 2010, DOI:10.1038/NMAT2804.

Katine, et al., "Current-Driven Magnetization Reversal and Spin-Wave Excitations in Co/Cu/Co Pillars", Physical Review Letters, 84(14):3149-52 (2000).

Nishimura, et al., "Magnetic tunnel junction device with perpendicular magnetization films for high-density magnetic random access memory", J. of Applied Physics, 90(8):5246-49 (2002).

Slonczewski, Conductance and exchange coupling of two ferromagnets separated by a tunneling barrier, Physical Review B, 39(10):6995-7002 (1989).

Slonczewski, "Current-driven excitation of magnetic multilayers", J. of Magnetism and Magnetic Materials, 159:L1-L7 (1996).

Slonczewski, "Theory and Application of Exchange-Driven Switching", IEEE, pp. CE-02 (2000).

PCT International Search Report and Written Opinion of the ISA, application No. PCT/US08/64794, May 23, 2008.

PCT International Search Report and Written Opinion of the ISA, application No. PCT/US08/66369, Jun. 9, 2008.

PCT International Search Report and Written Opinion of the ISA, application No. PCT/US10/47941, Sep. 7, 2010.

PCT International Search Report and Written Opinion of the ISA, application No. PCT/US10/59184, Dec. 7, 2010.

Office Action issued Apr. 2008 for U.S. Appl. No. 11/239,939.

Office Action issued Sep. 2008 for U.S. Appl. No. 11/239,939.

Office Action issued Jan. 2010 for U.S. Appl. No. 12/133,671.

Office Action issued Apr. 2009 for U.S. Appl. No. 12/133,671.

Office Action issued Mar. 2011 for U.S. Appl. No. 12/638,902.

* cited by examiner

MAGNETIC TUNNELING JUNCTION ELEMENTS HAVING MAGNETIC SUBSTRUCTURES(S) WITH A PERPENDICULAR ANISOTROPY AND MEMORIES USING SUCH MAGNETIC ELEMENTS

CROSS-REFERENCE TO RELATED APPLICATIONS

This application claims the benefit of provisional Patent Application Ser. No. 61/365,281, filed Jul. 16, 2010, assigned to the assignee of the present application, and incorporated herein by reference.

GOVERNMENT RIGHTS

This invention was made with U.S. Government support under Grant/Contract No. HR0011-09-C-0023 awarded by the DARPA. All copies are Approved for Public Release, Distribution Unlimited. The U.S. Government retains certain rights in this invention.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic elements written at least in part by a current driven through the magnetic element.

For example, FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional tunneling barrier layer 18 is nonmagnetic and is, for example, a thin insulator such as MgO. The conventional seed layer(s) 12 are typically utilized to aid in the growth of subsequent layers, such as the AFM layer 14, having a desired crystal structure. Direct exposure of the conventional free layer 20 to the top contact 24 may result in a disordered interface, dead magnetic regions and enhanced damping. Consequently, the conventional capping layer 22 is provided directly on the free layer 20, prior to deposition of the top contact 24. This conventional cap acts as a diffusion block and improves the surface quality of the conventional free layer 24.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically or ferromagnetically coupled through thin conductive layers, such as Ru. In such a SAF, multiple magnetic layers interleaved with a thin layer of Ru may be used. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy. For example, a perpendicular anisotropy may be induced in the conventional free layer 20. If the out-of-plane demagnetization energy exceeds the energy associated with the perpendicular anisotropy (perpendicular anisotropy energy), the perpendicular anisotropy may be termed a partial perpendicular magnetic anisotropy (PPMA). Thus, the magnetization 21 remains in plane despite having a perpendicular-to-plane anisotropy. If the out-of-plane demagnetization energy is less than the perpendicular anisotropy energy, then the magnetization of the free layer 20 would be out of plane (e.g. in the z direction in FIG. 1). A perpendicular magnetization 21 may be desirable for a variety of reasons, such as reducing the current density required to write to the free layer 20.

The conventional MTJ 10 is also required to be thermally stable for use in STT-RAM. During periods of latency, thermal fluctuations allow the magnetic moments within the conventional free layer 20 to oscillate and/or precess. These thermal fluctuations may result in the reversal of the magnetization 21 of the conventional free layer 20, making the conventional MTJ 10 unstable. In order to provide thermal stability against such fluctuations, the energy barrier separating oppositely oriented magnetization states in the free layer 20 is desired to be of sufficient magnitude. Typically, this is achieved at least in part by ensuring that the conventional free layer 20 has a sufficient volume. In addition, the free layer 20 generally has a number of anisotropies associated with it. The out-of-plane demagnetization energy relates to the shape anisotropy associated with the thin film anisotropy and generally confines the magnetization of the free layer 20 in plane. In the conventional MTJ 10 shown in FIG. 1, the conventional free layer 20 may have a shape anisotropy, allowing the free layer magnetization 21 to be stable along the x-axis as shown in FIG. 1. Further, there may be additional anisotropies, for example associated with the crystal structure of the conventional free layer 20.

Although the conventional magnetic element 10 may be written using spin transfer and used in an STT-RAM, there are drawbacks. In general, it is desirable to scale to higher memory densities and, therefore, smaller sizes of the conventional magnetic element 10. Magnetic elements 10 may have barriers to such scaling regardless of whether free layer magnetizations 21 are in-plane or perpendicular-to-plane. In particular, in the case that the magnetization 21 of the conventional free layer is in-plane, the current density required to write to the conventional magnetic element 10 may still be relatively high, while the magnetoresistance may still be lower than desired. For conventional magnetic elements in which the magnetization 21 of the conventional free layer 20 is perpendicular to plane, there may also be barriers to scaling. Typically, such magnetic elements 10 use high deposition temperatures, which may be inconsistent with preservation of other layers in the stack, such as the conventional barrier layer 18. The materials used in such a multilayer may also be limited if, as is generally desired, crystalline MgO is to be used as the conventional barrier layer 18. Finally, such magnetic elements may have asymmetric RH loops, which is undesirable for use in a magnetic memory.

Accordingly, what is needed is a method and system that may improve the scaling of the spin transfer torque based memories. The method and system described herein address such a need.

BRIEF SUMMARY OF THE INVENTION

The exemplary embodiments provide methods and systems for providing a magnetic substructure usable in a magnetic device, as well as a magnetic element and memory using the substructure. The magnetic substructure includes a plurality of ferromagnetic layers and a plurality of nonmagnetic layers. The ferromagnetic layers are interleaved with the plurality of nonmagnetic layers. The ferromagnetic layers are immiscible with and chemically stable with respect to the plurality of nonmagnetic layers. The ferromagnetic layers are substantially free of a magnetically dead layer-producing interaction with the plurality of nonmagnetic layers. Further, the nonmagnetic layers induce a perpendicular anisotropy in the plurality of ferromagnetic layers. The magnetic substructure is configured to be switchable between a plurality of stable magnetic states when a write current is passed through the magnetic substructure

DETAILED DESCRIPTION OF THE INVENTION

Figure 1:
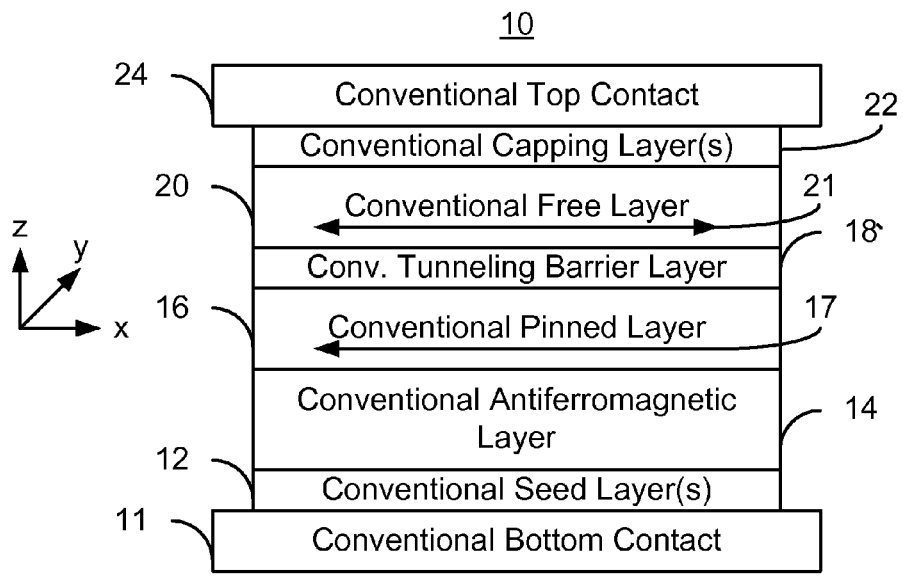
FIG. 1 depicts a conventional magnetic element.

The exemplary embodiments relate to magnetic elements usable in magnetic devices, such as magnetic memories, and the devices using such magnetic elements. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic substructure as well as a magnetic element and a magnetic memory utilizing the magnetic substructure are described. The magnetic substructure includes a plurality of ferromagnetic layers and a plurality of nonmagnetic layers. The ferromagnetic layers are interleaved with the nonmagnetic layers. The ferromagnetic layers are immiscible with and chemically stable with respect to the plurality of nonmagnetic layers. The ferromagnetic layers are substantially free of a magnetically dead layer-producing interaction with the plurality of nonmagnetic layers. Further, the nonmagnetic layers induce a perpendicular anisotropy in the ferromagnetic layers. The magnetic substructure is configured to be switchable between a plurality of stable magnetic states when a write current is passed through the magnetic substructure.

The exemplary embodiments are described in the context of particular magnetic substructures, magnetic elements, and magnetic memories having certain components. One of ordinary skill in the art will readily recognize that the present invention is consistent with the use of magnetic elements and magnetic memories having other and/or additional components and/or other features not inconsistent with the present invention. The method and system are also described in the context of current understanding of the spin transfer phenomenon, of magnetic anisotropy in layered structures, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic elements and/or substructures having particular layers. However, one of ordinary skill in the art will readily recognize that magnetic elements and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single elements and substructures. However, one of ordinary skill in the art will readily recognize that the method and system are consistent with the use of magnetic memories having multiple elements and using multiple substructures. Further, as used herein, "in-plane" is substantially within or parallel to the plane of one or more of the layers of a magnetic element. Conversely, "perpendicular" corresponds to a direction that is substantially perpendicular to one or more of the layers of the magnetic element.

In addition to the phenomenon described above, it has been determined that certain capping layers 22 may induce a PPMA in the conventional free layer 20. For example, an MgO capping layer 22 may induce a PPMA in the conventional free layer 20. In some such magnetic elements, the magnetization of the free layer 20 may be in plane. When combined with other anisotropies, the PPMA may result in the conventional magnetization 21 being perpendicular-to-plane. Though termed a "partial" perpendicular magnetic anisotropy, PPMA might actually result in a fully perpendicular magnetization. For both in-plane and perpendicular-to-plane magnetic elements that make use of PPMA, the PPMA may not scale to high memory densities. As the magnetic element 10 is scaled to higher densities, the free layer 20 is made thicker to provide thermal stability. In such a case, it has been determined that the PPMA may be dominated by other effects for thicker free layers 21. Further, the use of an MgO cap may have a parasitic resistance that is an increased portion of the resistance of the conventional magnetic element 10. Thus, scaling may be problematic particularly where PPMA is desired to be used to provide a perpendicular anisotropy for the free layer. Although other solutions are possible, such solutions generally have drawbacks. For example, magnetic elements that address some of these issues may include a large number of materials that may require multiple sputtering targets and other processing that may be difficult.

Figure 2:
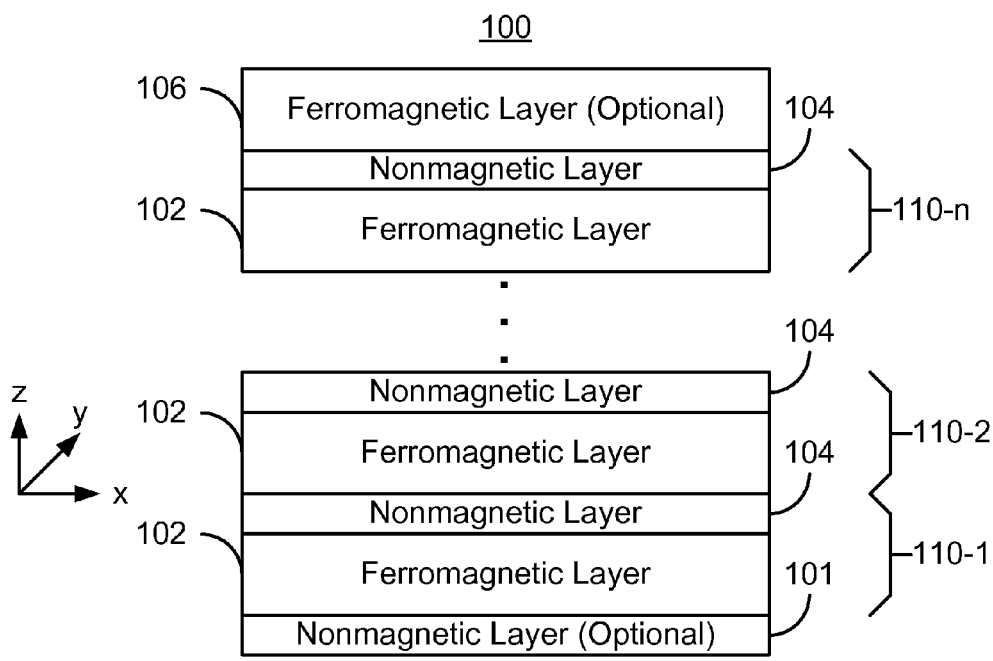
FIG. 2 depicts an exemplary embodiment of a magnetic substructure.

FIG. 2 depicts an exemplary embodiment of a magnetic substructure 100 use in a magnetic device, such as a magnetic element that may be used in magnetic memory such as an STT-RAM. The magnetic substructure 100 includes ferromagnetic layers 102 interleaved with nonmagnetic layers 104. The ferromagnetic layers 102 and nonmagnetic layers 104 may be considered to be combined into one or more bilayers 110-$i$. In the embodiment shown, there are n bilayers 110-1, 110-2, through 110-$n$. In the embodiment shown, an optional nonmagnetic layer 101 and an optional ferromagnetic layer 106 are shown. Either one or both of the layers 101 and 106 may be omitted. Depending upon the device in which the magnetic substructure 100 is to be used, the bottom layer and top layer may be desired to be ferromagnetic, both the bottom and the top layer may be desired to be nonmagnetic, only the bottom layer may be desired to be magnetic or only the top layer may be desired to be magnetic. Thus, the layers 101 and 106 may be used to tailor the magnetic substructure 100 to the desired application. Further, the ferromagnetic layer 106 and the nonmagnetic layer 101 are desired to be consistent with the ferromagnetic layers 102 and the nonmagnetic layers 104, respectively. Consequently, the discussion below with respect to the layers 102 and 104 may also apply to the layers 106 and 101, respectively.

The ferromagnetic layers 102 and nonmagnetic layers 104 are immiscible and chemically stable with respect to each other. Thus, the magnetic material(s) used in the ferromagnetic layers 102 tend not to mix with the nonmagnetic material(s) used in the nonmagnetic layers 104. Further, the ferromagnetic layers 102 do not chemically interact with the nonmagnetic layers 104 to form other compounds. Instead, the ferromagnetic layers 102 and nonmagnetic layers 104 form clean interfaces. Stated differently, the ferromagnetic layers 102 and nonmagnetic layers 104 form separate structures rather than an alloy. Further, in some embodiments, magnetically "dead" layers are not formed in the ferromagnetic layers 102 at or near the interfaces with adjoining nonmagnetic layers. In such embodiments, the ferromagnetic layers 102 are free from interactions with the nonmagnetic layers 104 that would cause such dead layers to form at or near the interfaces. In other embodiments, it may be desirable to provide a depressed magnetization of the ferromagnetic layers 102 such that a free layer making use of the magnetic substructure has a reduced magnetization. In some such embodiments, mixing and formation of magnetically "dead" layers may be allowed. However, other mechanisms, such as doping may also be used to provide ferromagnetic layers 102 having a reduced magnetization. Although shown as distinct layers in FIG. 2, in some embodiments, the nonmagnetic layers 104 may be discontinuous. For example, the nonmagnetic layers 104 may have pinholes. In other embodiments, the holes may be sufficiently large that the nonmagnetic layers 104 may be considered to be granular in nature. Thus, a nonmagnetic layer 104 may be formed of islands. In some such embodiments, the thickness of such islands in the z-direction is desired to be not more than ten Angstroms. Further, in some embodiments, the thickness of such islands in the z-direction may not be more than eight Angstroms. In such embodiments, portions of the ferromagnetic layers 102 may extend through the nonmagnetic layers 104 such that the ferromagnetic layers 102 are in physical contact with each other. The density of the nonmagnetic islands in such embodiments would, however fall to zero within some regions of the magnetic substructure 100 corresponding to the ferromagnetic layers 102.

Materials that may be used for the nonmagnetic layers 104 such that the magnetic structure 100 has the above properties may include one or more of materials such as Al, AlN, aluminum oxide, Au, Cr, crystalline MgO, Cu, doped MgO, indium tin oxide, Mg, Mo, NiO, Pd, Pt, Ru, RuO2, silicon oxide, SiN, Ta, TaN, Ti, TiN, V, W, Y. In addition, the nonmagnetic layers 104 may be conductive (e.g. metallic) or insulating (e.g. oxides). For example, crystalline MgO might be used for one or more of the nonmagnetic layers 104. In embodiments in which insulating nonmagnetic layers 104 are used, it may be preferred to have the nonmagnetic layers 104 be discontinuous to reduce the resistance of the nonmagnetic layers 104. Materials that may be used for the ferromagnetic layers 102 such that the magnetic structure 100 has the above properties include one or more of Co, Fe, and Ni. Further, the ferromagnetic layers 102 may be alloys or oxides. In some embodiments, CoFe and/or CoFeB of the desired stoichiometry may be used for the ferromagnetic layers. The alloys or oxides of Co, Fe, and Ni used in the magnetic layers 102 may include other materials. For example, in some embodiments, the magnetic substructure 100 may have a magnetization of at least one hundred and not more than one thousand three hundred emu/cc. In such embodiments, the stoichiometry of the CoFeB as well as the thickness of the Cr and/or V used for the nonmagnetic layers 104 may be tailored to achieve the desired magnetization in addition to the above properties. In addition, the materials selected may also be selected for other properties. For example, in some embodiments, the materials selected for the layers 102 and 104 may provide the desired growth template for layers such as a crystalline MgO barrier layer. In addition, materials for the layers 102 and 104 and thicknesses of the layers 102 and 104 may be selected such that the magnetic substructure 100 has a higher magnetoresistance and/or is switchable using spin transfer torque.

Although shown as the same, the ferromagnetic layers 102 may be the same or may differ in composition and thickness. Similarly, the nonmagnetic layers 104 may be the same or may differ in composition and thickness. In general, however, it is desired that the ferromagnetic layers 102 be thicker than the nonmagnetic layers 104. In some embodiments, for example, each ferromagnetic layer 102 is at least three times thicker than the adjoining nonmagnetic layer 104. Further, the thicknesses and number or repeats (n) of the ferromagnetic layers 102 and nonmagnetic layers 104 may be tailored to provide the desired total thickness of the magnetic substructure 100. The thicknesses and number or repeats (n) of the ferromagnetic layers 102 and nonmagnetic layers 104 may also be tailored to provide other properties, such as the desired magnetization, of the magnetic substructure 100. In some embodiments, the total thickness of the magnetic substructure 100 is desired to be at least two nanometers and not more than four nanometers. Such a thickness may allow for the thermal stability of the magnetic substructure at smaller sizes in plane (parallel to the x-y plane). For even smaller sizes in plane, the thickness of the magnetic substructure may be further increased.

The magnetic substructure 100, particularly the nonmagnetic layers 104, may also be configured to provide the desired interaction between the ferromagnetic layers 102. For example, if the nonmagnetic layers 104 are thinner, particularly if the nonmagnetic layers 104 include pinholes and/or are discontinuous, the ferromagnetic layers may be strongly ferromagnetically coupled. In such embodiments, the ferromagnetic layers 102 of the magnetic substructure may act essentially as a single layer. In other embodiments, the nonmagnetic layers 104 may be configured such that the ferromagnetic layers 102 are antiferromagnetically coupled. In other embodiments, the nonmagnetic layers 104 may be continuous but the ferromagnetic layers 102 may be ferromagnetically coupled. In still other embodiments, the nonmagnetic layers 104 may be made thicker still, such that ferromagnetic layers 102 are only dipole coupled. Further, the thicknesses of the nonmagnetic layers 104 may be varied such that some of the ferromagnetic layers 102 have a mixture of ferromagnetically coupling, antiferromagnetic coupling, and/or dipole coupling. For example, the RKKY coupling between the ferromagnetic layers 104 oscillates between antiferromagnetic and ferromagnetic coupling for varying thicknesses of the nonmagnetic layers 104. By varying the thickness of the nonmagnetic layers 104, the coupling between ferromagnetic layers 102 in a single structure 100 or in differing structures may be ferromagnetic or antiferromagnetic. In addition, the dipole coupling dominates at large thicknesses of the nonmagnetic layers 104. Thus, the thickness of the nonmagnetic layers 104 may be used to tailor the magnetic coupling between the ferromagnetic layers 102.

Because the ferromagnetic layers 102 are alternated with the nonmagnetic layers 104, the magnetic substructure 100 may have a reduced moment. For example, by alternating CoFe, CoFeB, an alloy including CoFe and/or an alloy including CoFeB with a nonmagnetic layer such as Cr and/or V, the magnetic substructure may have the desired magnetic moment. For example, a lower moment for the substructure may be achieved. The low moment may be desired to reduce the switching current for a free layer of a magnetic element, as described below. In addition, the ferromagnetic layers 102 may still act magnetically as a single layer.

In addition to the above-identified properties, it has also been determined that the magnetic substructure 100 may also exhibit PPMA. More specifically, the combination of the ferromagnetic layers interleaved with the nonmagnetic layers 104 may induce a perpendicular anisotropy in the adjacent ferromagnetic layers 102. The ferromagnetic layers 102 may have additional contributions to the perpendicular anisotropy. Thus, the magnetic moment of the magnetic substructure may be in plane if the out-of-plane demagnetization energy exceeds the perpendicular anisotropy. In other embodiments, the perpendicular anisotropy induced in the ferromagnetic layers may be such that the magnetic moment of the magnetic substructure 100 is perpendicular to plane (e.g. in the z-direction). Thus, the magnetic substructure 100 might have an easy axis parallel to the z-direction. In such an embodiment, the perpendicular anisotropy for the magnetic substructure 100, to which PPMA contributes, corresponds to a perpendicular anisotropy energy that is greater than the out-of-plane demagnetization energy for the magnetic substructure 100. Thus, a thick (e.g. two nanometers or greater in thickness) magnetic substructure that is thermally stable may be provided while still maintaining PPMA to provide a significant anisotropy for the magnetic substructure 100. As a result, the magnetic substructure 100 may exhibit a reduced switching current density for spin transfer torque that is possible with a perpendicular anisotropy.

Further, the magnetic substructure 100 may exhibit lower damping. Consequently, the magnetic substructure 100 may be used in scaling STT-RAM technology to higher densities. These benefits may be achieved fairly simply from a processing perspective. For example, if the same ferromagnetic material is used for all ferromagnetic layers 102 and the same nonmagnetic material used for all of the nonmagnetic layers 104, the substructure 100 may be fabricated with only two deposition targets. In addition, high deposition temperatures, for example temperatures in excess of four hundred degrees Celsius, need not be used. Consequently, the magnetic substructure 100 may be consistent with magnetic devices such as magnetic tunneling junctions using crystalline MgO as a tunneling barrier layer. Finally, note that because the layer thickness and materials may be adjusted throughout the magnetic substructure 100, there may be an improved ability to tailor the properties of the magnetic substructure 100.

Figure 3:
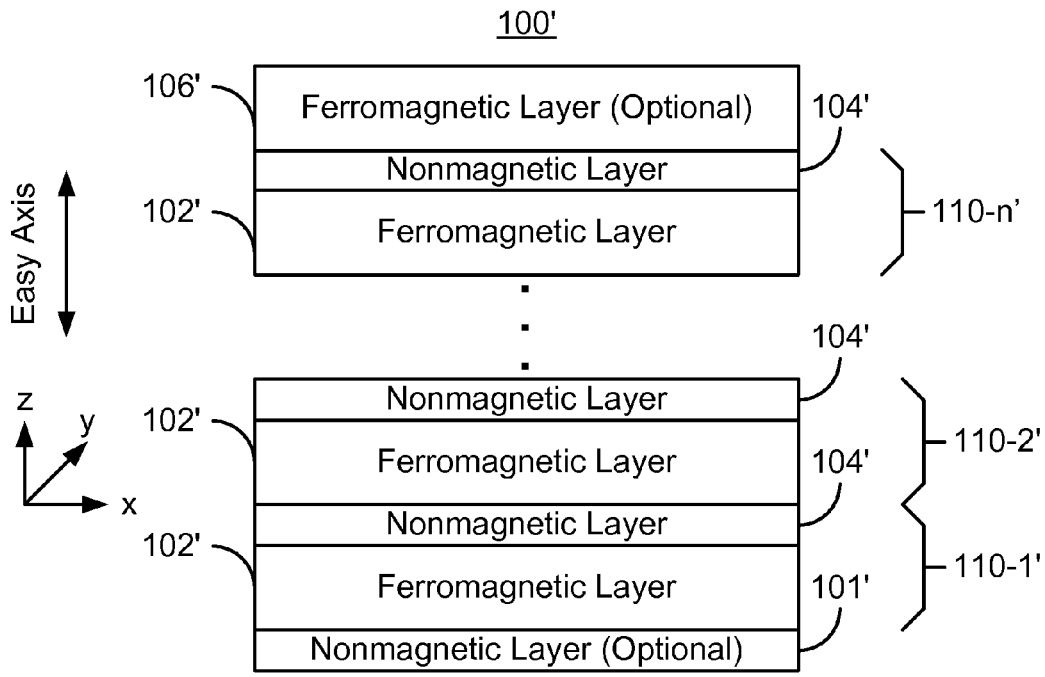
FIG. 3 depicts another exemplary embodiment of a magnetic substructure.

FIG. 3 depicts another exemplary embodiment of a magnetic substructure 100'. The magnetic substructure 100' is analogous to the magnetic substructure 100. Consequently, similar portions of the magnetic substructure 100' are labeled similarly to the magnetic substructure 100. Consequently, the magnetic substructure 100' includes optional nonmagnetic layer 101', ferromagnetic layers 102', nonmagnetic layers 104', and optional ferromagnetic layer 106' corresponding to optional nonmagnetic layer 101, ferromagnetic layers 102, nonmagnetic layers 104, and optional ferromagnetic layer 106, respectively. Thus, bilayers 110-1', 110-2', through 110-n' correspond to bilayers 110-1, 110-2, through 110-n, respectively.

The ferromagnetic layers 102' and nonmagnetic layers 104' of the magnetic substructure 100' may include analogous materials to and at analogous thicknesses to the materials and thicknesses used for the ferromagnetic layers 102 and nonmagnetic layers 104, respectively. Although the ferromagnetic layers 102' are shown as having the same thickness, different thicknesses are also possible. Similarly, although the nonmagnetic layers 104' are shown as having the same thickness, different thicknesses are also possible. Finally, although shown as continuous layers, pinholes and discontinuous layers, particularly for the nonmagnetic layers 104', may be possible. Such discontinuities may ensure direct exchange coupling between the magnetic sublayers on either side of a given non-magnetic sub-layer.

The ferromagnetic layers 102' and nonmagnetic layers 104' are configured such that a strong perpendicular anisotropy is induced in the magnetic substructure 100'. More specifically, the interleaving of the ferromagnetic layers 102' and nonmagnetic layers 104' induces a PPMA in the layers which in combination with any other components of the magnetic anisotropy perpendicular to plane (i.e. in the z-direction) exceeds the out-of-plane demagnetization energy. Thus, the easy axis of the magnetic substructure 100' is in the z-direction, as shown in FIG. 3. In order to achieve such an anisotropy, the materials and thicknesses of the layers 102' and 104' may be tailored. For example, the ferromagnetic layers 102' may include CoFeB and the nonmagnetic layers 102' may include Cr and/or V. For example, $Co_{20}Fe_{60}B_{20}$ may be used. Further, the thickness of the nonmagnetic layers 104' may be not more than one-third of the adjoining magnetic layer 102'. Such tailoring of the ferromagnetic layers 102' and nonmagnetic layers 104' may provide the desired perpendicular anisotropy even for thick magnetic substructures 100'. For example, in some embodiments, the thickness (dimension in the z-direction) of the magnetic substructure 100' is greater than or equal to two nanometers. In addition, in some embodiments, other perpendicular anisotropies may be induced in the ferromagnetic layers 104' and/or the in-plane components of the magnetic anisotropy may be reduced. Thus, the easy axis of the magnetic substructure 100' may be in the z-direction.

Thus, the magnetic substructure 100' may have an easy axis perpendicular to plane. As a result, the magnetic substructure 100' may be used in a magnetic device in which the magnetization is desired to be perpendicular to plane. For example, the magnetic substructure may be used in the free layer of a magnetic tunneling junction writable using spin transfer torque. Consequently, certain benefits of the magnetic substructure 100, such as a lower write current density, may be achieved. In addition, although the perpendicular anisotropy may interfacial in nature, the interleaving of layers 102' and 104' may allow the anisotropy may be present in thicker, thermally stable magnetic substructures 100' having smaller in-plane dimensions. Thus, a magnetic element using the magnetic substructure 100' may be scalable to higher densities and, therefore, smaller sizes in plane. Further, the magnetic substructure 100' may share the one or more of the remaining benefits of the magnetic substructure 100, such as a higher magnetoresistance.

Figure 4:
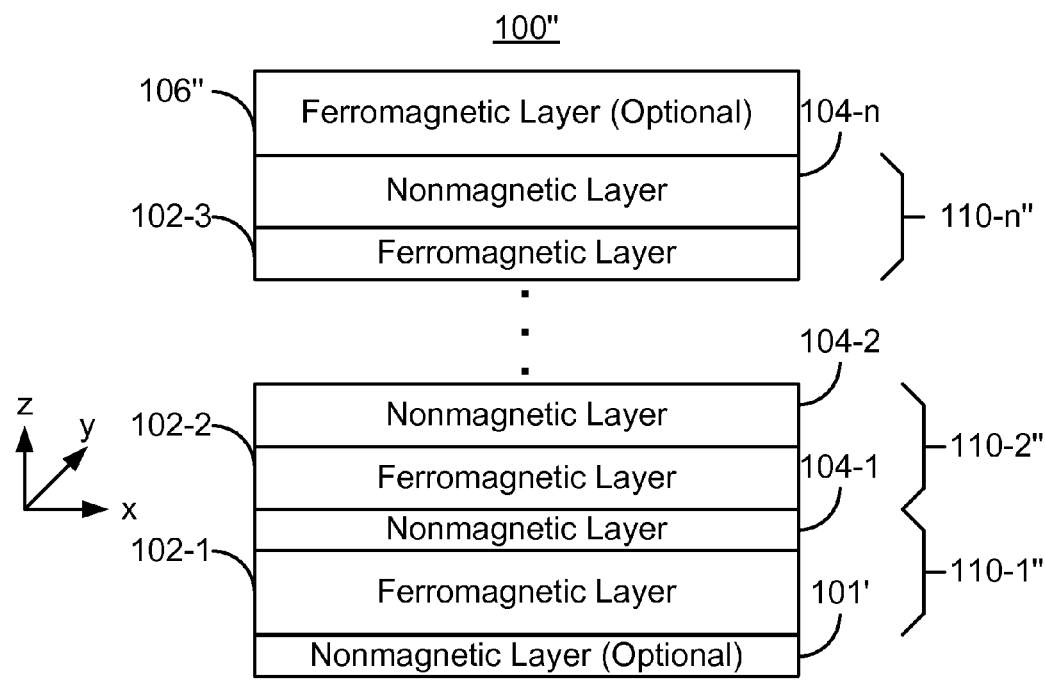
FIG. 4 depicts another exemplary embodiment of a magnetic substructure.

FIG. 4 depicts another exemplary embodiment of a magnetic substructure 100". The magnetic substructure 100" is analogous to the magnetic substructure 100. Consequently, similar portions of the magnetic substructure 100" are labeled similarly to the magnetic substructure 100. Consequently, the magnetic substructure 100" includes optional nonmagnetic layer 101", ferromagnetic layers 102-1, 102-2, through 102-n, nonmagnetic layers 104-1, 104-2, through 104-n, and optional ferromagnetic layer 106" corresponding to optional nonmagnetic layer 101, ferromagnetic layers 102, nonmagnetic layers 104, and optional ferromagnetic layer 106, respectively. Thus, bilayers 110-1", 110-2", through 110-n" correspond to bilayers 110-1, 110-2, through 110-n, respectively.

The ferromagnetic layers 102" and nonmagnetic layers 104" of the magnetic substructure 100" may include materials analogous to the materials and used for the ferromagnetic layers 102 and nonmagnetic layers 104, respectively. In the embodiment shown, the thicknesses of the ferromagnetic layers 102-1 through 102-n and the thicknesses of the nonmagnetic layers 104-1 through 104-n vary. However, in other embodiments, only the thicknesses of the ferromagnetic layers 102-1 through 102-n vary. In still other embodiments, only the thicknesses of the nonmagnetic layers 104-1 through 104-n vary. Further, the thicknesses of the layers 102-1 through 102-n and 104-1 through 104-n are shown as varying in a particular manner. However, the thicknesses of the layers 102-1 through 102-n and 104-1 through 104-n may vary in another manner. Further, the material(s) used in the magnetic substructure 100" may be analogous to those used in magnetic substructures 100 and 100'.

By varying the thicknesses of the layers 102-1 through 102-n and/or the thicknesses of the layers 104-1 through 104-n, various properties of the magnetic substructure 100' may be tailored. More specifically, the coupling between the magnetic layers 102-1 through 102-n, the magnetic anisotropy, the magnetoresistance, the magnetic moment, interlayer magnetic interaction, and/or other characteristics of the magnetic substructure 100' may be adapted to the desired application. Further, as discussed above, the materials used for one or more of the ferromagnetic layers 102-1 through 102-n and nonmagnetic layers 104-1 through 104-n may also be varied. As a result, the ability to configure the magnetic substructure to have the desired properties may be improved.

Figure 5:
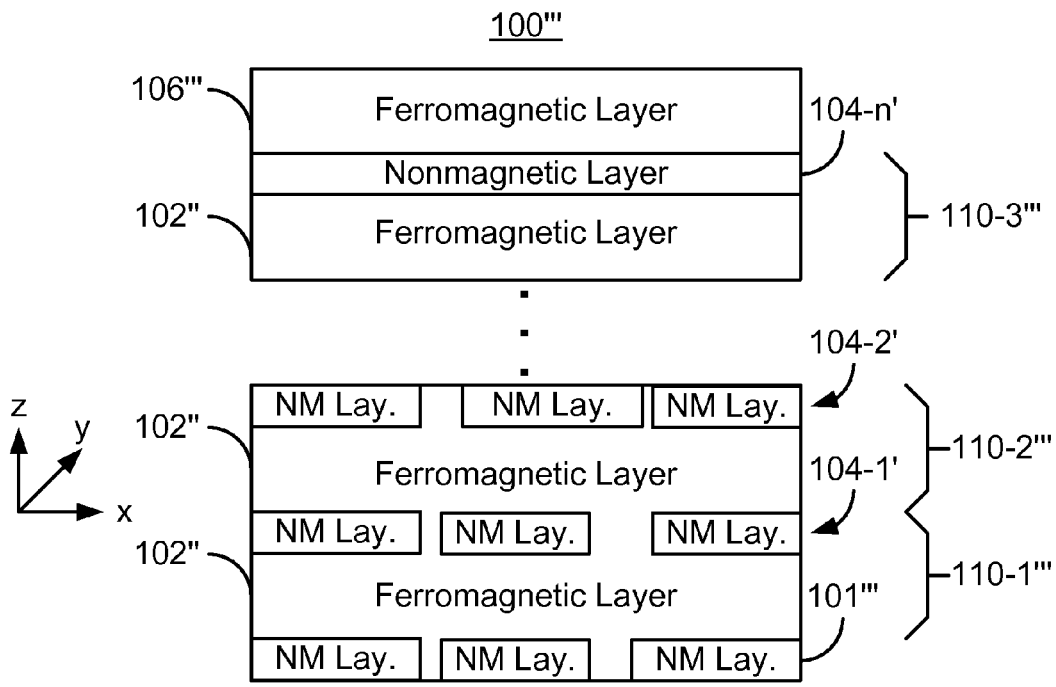
FIG. 5 depicts another exemplary embodiment of a magnetic substructure.

FIG. 5 depicts another exemplary embodiment of a magnetic substructure 100'''. The magnetic substructure 100''' is analogous to the magnetic substructure 100. Consequently, similar portions of the magnetic substructure 100''' are labeled similarly to the magnetic substructure 100. Consequently, the magnetic substructure 100''' includes optional nonmagnetic layer 101''', ferromagnetic layers 102'', nonmagnetic layers 104'', and optional ferromagnetic layer 106'' corresponding to optional nonmagnetic layer 101, ferromagnetic layers 102, nonmagnetic layers 104, and optional ferromagnetic layer 106, respectively. Thus, bilayers 110-1''', 110-2''', through 110-n''' correspond to bilayers 110-1, 110-2, through 110-n, respectively. Although the substructure 100''' is shown as including continuous nonmagnetic layers 104-n', in other embodiments, all of the nonmagnetic layers 104-i' are discontinuous. In other embodiments, a different number of nonmagnetic layers 104-i' are discontinuous.

The ferromagnetic layers 102''' and nonmagnetic layers 104-1' through 104-n' of the magnetic substructure 100''' may include materials analogous to the materials and used for the ferromagnetic layers 102/102'/102-1 through 102-n and nonmagnetic layers 104/104'/104-1 through 104-n, respectively. Similarly, the ferromagnetic layers 102''' and nonmagnetic layers 104-1' through 104-n' of the magnetic substructure 100''' may have thicknesses analogous to those described above for the ferromagnetic layers 102/102'/102-1 through 102-n and nonmagnetic layers 104/104'/104-1 through 104-n, respectively. However, as shown in FIG. 5, at least some of the nonmagnetic layers 104-1' through 104-n' are discontinuous. Similarly, although shown as continuous, in other embodiments, one or more of the ferromagnetic layers 102" may be discontinuous. In the embodiment shown, at least one of the nonmagnetic layers 104-n' is continuous. However, in other embodiments, a different number of nonmagnetic layers 104-1' through 104-n' may be discontinuous. Further, the discontinuous layers 104-1' and 104-2' could have small pinholes, larger holes, or may be made up of nonmagnetic islands. In some embodiments, the islands would be desired to be flat, '''pancakes' in shape. In other embodiments, the aspect ratio of the islands could be different. In the embodiments shown, however, the density of the islands increases in the regions corresponding to the layers 104-1' and 104-2', but decreases or falls to zero within the regions corresponding to the ferromagnetic layers 102". The islands are desired to be not more than ten Angstroms thick. Further, in some embodiments, the thickness of such islands in the z-direction may not be more than eight Angstroms. The coupling between the ferromagnetic layers 102" may be improved because the ferromagnetic layers 102" extend through the discontinuous layers 104-1' and 104-2'. Thus, the ferromagnetic layers 102" may function in a manner that is more similar to a single ferromagnetic layer. This characteristic may be desirable in some applications for which the magnetic element 100''' is desired to be used. Thus, the thicknesses and continuity of the layers 102" and 104-1' through 104-n' may also be used to optimize the magnetic structure 100'''.

Figure 6:
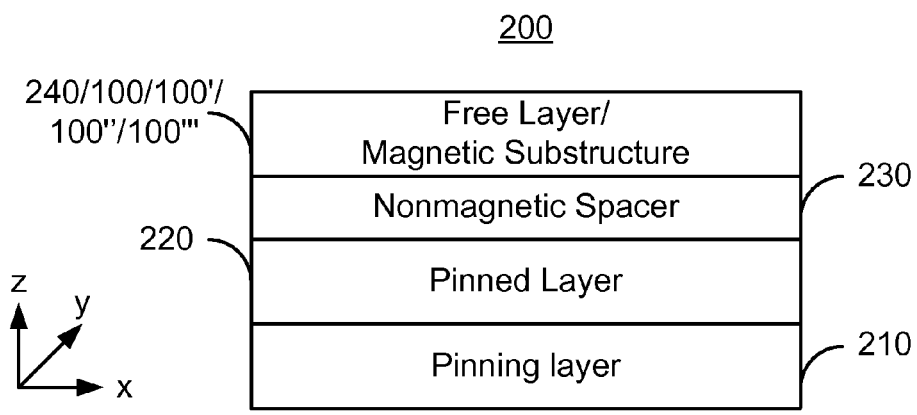
FIG. 6 depicts an exemplary embodiment of a magnetic element utilizing a magnetic substructure.

FIG. 6 depicts an exemplary embodiment of a magnetic element 200 utilizing a magnetic substructure such as the magnetic substructure 100, 100', 100", and/or 100'''. For clarity, FIG. 6 is not so scale. The magnetic element 200 may be used in magnetic memory such as an STT-RAM. The magnetic element 200 includes a pinned layer 220, a nonmagnetic spacer layer 230, and a free layer 240. Also shown is optional pinning layer 210, which may be used to fix the magnetization (not shown) of the pinned layer 220. In some embodiments, the optional pinning layer 210 is an AFM layer that pins the magnetization (not shown) of the pinned layer 220 by an exchange-bias interaction. However, in other embodiments, the optional pinning layer 210 may be omitted. Further, the magnetic element 200 may include other and/or additional layers such as seed and/or capping layer(s). The magnetic element 200 is also configured to allow the free layer 240 to be switched between stable magnetic states when a write current is passed through the magnetic element 240. Thus, the free layer 240 is switchable utilizing spin transfer torque.

The pinned layer 220 and the free layer 240 are magnetic and thus may include one or more of Ni, Fe, and Co, particularly in an alloy form. Although depicted as a simple layer, the pinned layer 220 may include multiple layers. For example, the pinned layer 220 may be a SAF including magnetic layers antiferromagnetically or ferromagnetically coupled through thin layers, such as Ru. In such a SAF, multiple magnetic layers interleaved with thin layer(s) of Ru or other material may be used.

The spacer layer 230 is nonmagnetic. In some embodiments, the spacer layer 230 is an insulator, for example a tunneling barrier. In such embodiments, the spacer layer 230 may include crystalline MgO, which may enhance the tunneling magnetoresistance (TMR) of the magnetic element. In other embodiments, the spacer layer may be a conductor, such as Cu. In alternate embodiments, the spacer layer 230 might have another structure, for example a granular layer including conductive channels in an insulating matrix.

The free layer 240 has a changeable magnetization (not shown) that may be switched via spin transfer. The free layer 240 includes a magnetic substructure such as the magnetic substructure 100, 100', 100", and/or 100'''. For simplicity, the magnetic substructure 100, 100', 100", and/or 100''' is not shown. In some embodiments, the free layer 240 consists of the magnetic substructure 100, 100', 100", and/or 100'''. In other embodiments, the free layer may include other layer(s). For example, the free layer may be a SAF that includes the magnetic substructure 100, 100', 100", and/or 100''' as one or more of the ferromagnetic layers. Alternatively, the free layer 240 may include a ferromagnetic layer or multilayer adjoining the magnetic substructure 100, 100', 100", and/or 100'''. Thus the free layer 240 may include ferromagnetic layers interleaved with nonmagnetic layers with which ferromagnetic layers are immiscible, chemically stable with respect to, and substantially free of an interaction that would produce a magnetically dead layer in the ferromagnetic layers. Further, as described below, a perpendicular anisotropy may be induced in ferromagnetic layers, and thus the free layer 240.

The use of the magnetic substructure 100, 100', 100", and/or 100''' in/as the free layer 240 may provide a number of benefits. The free layer 240 may have a perpendicular anisotropy. At least a portion of the perpendicular anisotropy may be induced by a PPMA within the magnetic substructure 100, 100', 100", and/or 100'''. In some embodiments, the total perpendicular anisotropy is such that the easy axis of the free layer 240 is perpendicular to plane (e.g. in the z-direction). Thus, the free layer 240 may have an out-of-plane demagnetization energy less than its perpendicular anisotropy energy. In other embodiments, the free layer 240 may have an out-of-plane demagnetization energy greater than or equal to its perpendicular anisotropy energy. The easy axis of such a free layer 240 may be in plane. As a result of the higher perpendicular anisotropy, the switching current density for spin transfer torque may be reduced. This perpendicular anisotropy may be provided at least in part via PPMA even where the free layer 240 is quite thick due to a thick magnetic substructure 100, 100', 100", and/or 100'''. In some embodiments, the magnetic substructure 100, 100', 100", and/or 100''' and thus the free layer 240 may be at least two nanometers thick. In some such embodiments, the magnetic substructure 100, 100', 100", and/or 100''', and thus the free layer may be up to four nanometers thick. Thus, the free layer 240 may be thermally stable at smaller dimensions in-plane and still maintain a perpendicular anisotropy for a reduced switching current density.

The materials and layer thicknesses for the magnetic substructure 100, 100', 100", and/or 100''' and thus the free layer 240 may also be selected to enhance performance of the magnetic element 200. Materials may be elected to improve the TMR. For example, CoFe, CoFeB (such as $Co_{20}Fe_{60}B_{20}$), and/or like ferromagnetic materials may be used in the magnetic substructure 100, 100', 100", and/or 100''' to provide a microstructure that is consistent with a crystalline MgO nonmagnetic spacer layer 230. Thus, a desired barrier layer may be used for the nonmagnetic spacer layer 230. Because deposition temperatures in excess of four hundred degrees Celsius need not be used to fabricate the magnetic substructure 100, 100', 100", and/or 100''' and thus the free layer 240, the desired tunneling barrier layer may survive fabrication of the magnetic element 200. Further, the magnetic substructure 100, 100', 100", and/or 100''' may have a lower moment, which may further reduce the switching current density for the magnetic element 200. For example, moment may be reduced because the nonmagnetic layers are introduced into the magnetic substructure 100, 100', 100", and/or 100". In addition, the magnetic coupling between the ferromagnetic layers of the magnetic substructure 100, 100', 100", and/or 100" may be tailored. The ferromagnetic layers of the magnetic substructure 100, 100', 100", and/or 100'" may be ferromagnetically coupled, antiferromagnetically coupled, or primarily dipole coupled. When antiferromagnetically coupled, the moment of the free layer 240 may be reduced. These configurations may be achieved using a relatively small number of materials and without high temperature deposition. Moreover, the magnetic substructure 100, 100', 100", and/or 100'" may be configured to have lower damping. In addition, as insulating capping layers, such as MgO may be omitted in favor of using the magnetic substructure 100, 100', 100", and/or 100'", the parasitic resistance of portions of the magnetic element 200 may be reduced. Thus, the performance of the magnetic element 200 may be enhanced through the use of the magnetic substructure 100, 100', 100", and/or 100'". Consequently, the magnetic element 200 using the magnetic substructure 100, 100', 100", and/or 100'" in the free layer 240 may function as desired for smaller sizes in plane, and thus higher STT-RAM densities.

Figure 7:
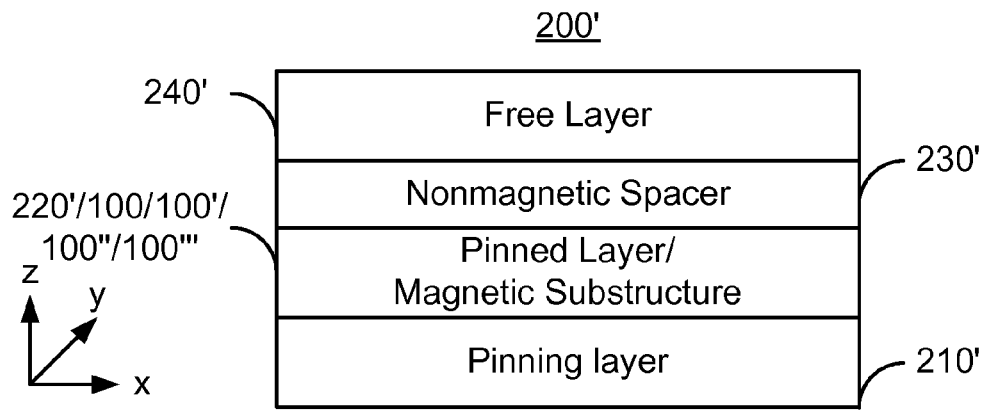
FIG. 7 depicts another exemplary embodiment of a magnetic element utilizing a magnetic substructure.

FIG. 7 depicts another exemplary embodiment of a magnetic element 200' utilizing a magnetic substructure such as the magnetic substructure 100, 100', 100", and/or 100'". For clarity, FIG. 7 is not so scale. The magnetic element 200' may be used in magnetic memory such as an STT-RAM. The magnetic element 200' is analogous to the magnetic element 200, and thus includes similar structures. The magnetic element 200' includes an optional pinning layer 210', a pinned layer 220', a nonmagnetic spacer layer 230', and a free layer 240' that are analogous to the optional pinning layer 210, the pinned layer 220, the nonmagnetic spacer layer 230, and the free layer 240. The layers 210', 220', 230', and 240' have a structure and function analogous to those of the layers 210, 220, 230, and 240, respectively. However, in the embodiment shown, the pinned layer 220' rather than the free layer 240' includes the magnetic substructure 100, 100', 100", and/or 100'". Further, the magnetic element 200' may include other and/or additional layers such as seed and/or capping layer(s). The magnetic element 200 is also configured to allow the free layer 240' to be switched between stable magnetic states when a write current is passed through the magnetic element 240. Thus, the free layer 240' is switchable utilizing spin transfer torque.

The free layer 240' is magnetic and thus may include one or more of Ni, Fe, and Co, particularly in an alloy form. Further, the free layer 240' has a changeable magnetization that is switchable utilizing spin transfer. Although depicted as a simple layer, the free layer 240' may include multiple layers. For example, the free layer 240' may be a SAF including magnetic layers antiferromagnetically or ferromagnetically coupled through thin layers, such as Ru. In such a SAF, multiple magnetic layers interleaved with thin layer(s) of Ru or other material may be used. The spacer layer 230' is analogous to the spacer layer 230.

The pinned layer 220' has its magnetization (not shown) that is fixed in a particular direction. The pinned layer 220' also includes a magnetic substructure such as the magnetic substructure 100, 100', 100", and/or 100'". For simplicity, the magnetic substructure 100, 100', 100", and/or 100'" is not shown. In some embodiments, the pinned layer 220' consists of the magnetic substructure 100, 100', 100", and/or 100'". In other embodiments, the pinned layer 220' may include other layer(s). For example, the pinned layer 220' may be a SAF that includes the magnetic substructure 100, 100', 100", and/or 100'" as one or more of the ferromagnetic layers. Alternatively, the pinned layer 220' may include a ferromagnetic layer or multilayer adjoining the magnetic substructure 100, 100', 100", and/or 100'". Thus the pinned layer 220' may include ferromagnetic layers interleaved with nonmagnetic layers with which ferromagnetic layers are immiscible, chemically stable with respect to, and substantially free of an interaction that would produce a magnetically dead layer in the ferromagnetic layers. Further, as described below, a perpendicular anisotropy may be induced in ferromagnetic layers, and thus the pinned layer 220'.

The characteristics of the magnetic substructures 100, 100', 100", and/or 100'" and the benefits for the magnetic element 200' may be analogous to those described above for the magnetic element 200. In particular, use of the magnetic substructure 100, 100', 100", and/or 100'" in/as the pinned layer 220' may allow the pinned layer 220' to have a perpendicular anisotropy, for example induced by a PPMA within the magnetic substructure 100, 100', 100", and/or 100'". In some embodiments, the perpendicular anisotropy is such that the easy axis of the pinned layer 220' is perpendicular to plane (e.g. in the z-direction). In some embodiments, the perpendicular anisotropy improves the pinning of the magnetization of the pinned layer 220' perpendicular to plane (in the z-direction). Thus, the benefits of a perpendicular orientation may be achieved for the magnetic element 200'. For example, a reduced switching current density may be achieved.

Figure 8:
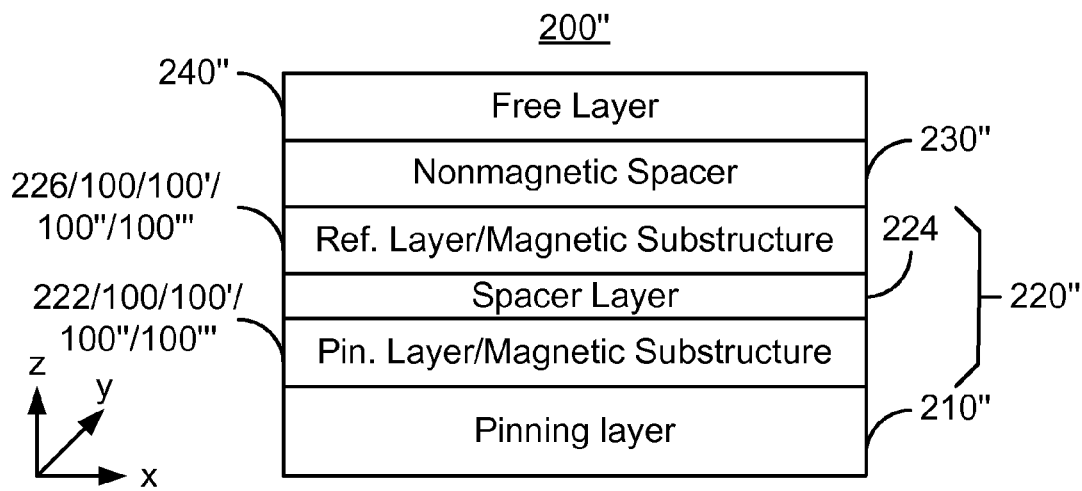
FIG. 8 depicts another exemplary embodiment of a magnetic element utilizing a magnetic substructure.

FIG. 8 depicts another exemplary embodiment of a magnetic element 200" utilizing a magnetic substructure such as the magnetic substructure 100, 100', 100", and/or 100'". For clarity, FIG. 8 is not so scale. The magnetic element 200" may be used in magnetic memory such as an STT-RAM. The magnetic element 200" is analogous to the magnetic elements 200 and 200', and thus includes similar structures. The magnetic element 200" includes an optional pinning layer 210", a pinned layer 220", a nonmagnetic spacer layer 230", and a free layer 240" that are analogous to the optional pinning layer 210/210', the pinned layer 220/220', the nonmagnetic spacer layer 230/230', and the free layer 240/240'. The layers 210", 220", 230", and 240" have a structure and function analogous to those of the layers 210/210', 220/220', 230/230', and 240/240', respectively. However, in the embodiment shown, the pinned layer 220" includes a reference layer 226, a spacer layer 224, and a pinned layer 222. The pinned layer 220" may thus be a SAF. In the embodiment shown, the reference layer 226 and/or the pinned layer 222 include the magnetic structure 100, 100', 100", and/or 100'". Thus, benefits described above for the magnetic element 200' may be achieved.

Figure 9:
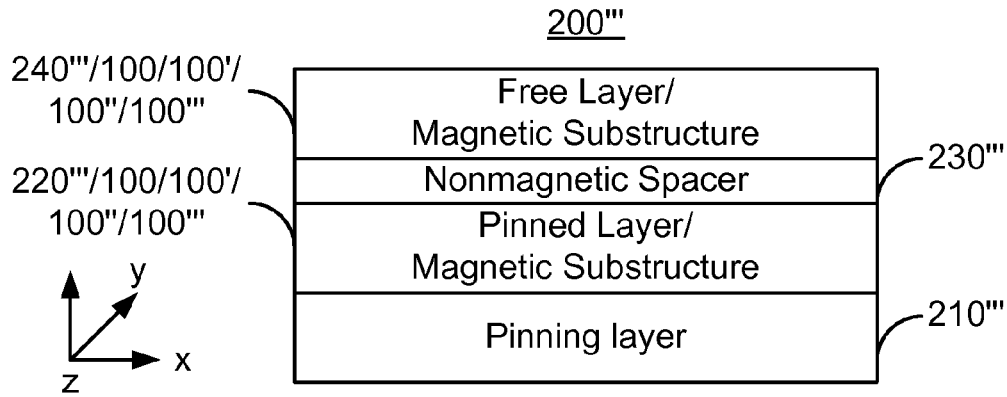
FIG. 9 depicts another exemplary embodiment of a magnetic element utilizing a magnetic substructure.

FIG. 9 depicts another exemplary embodiment of a magnetic element 200'" utilizing a magnetic substructure such as the magnetic substructure 100, 100', 100", and/or 100'". For clarity, FIG. 9 is not so scale. The magnetic element 200'" may be used in magnetic memory such as an STT-RAM. The magnetic element 200'" is analogous to the magnetic elements 200, 200', and 200" and thus includes similar structures. The magnetic element 200'" includes an optional pinning layer 210'", a pinned layer 220'", a nonmagnetic spacer layer 230'", and a free layer 240'" that are analogous to the optional pinning layer 210/210'/210", the pinned layer 220/220'/220", the nonmagnetic spacer layer 230/230'/230", and the free layer 240/240'/240". The layers 210'", 220'", 230'", and 240'" have a structure and function analogous to those of the layers 210/210'/210", 220/220'/220", 230/230'/230", and 240/240'/240", respectively. Although not separately shown, the pinned layer 220'" may include multiple magnetic structures 100/100'/100"/100", for example analogous to the pinned layer 220". Alternatively, the pinned layer 220'" may include a single magnetic substructure 100/100'/100"/100", for example analogous to the pinned layer 220'. The free layer 240'" also includes one or more magnetic substructures 100/

100'/100"/100'". Thus, benefits described above for the magnetic elements 200, 200', and/or 200" may be achieved.

Figure 10:
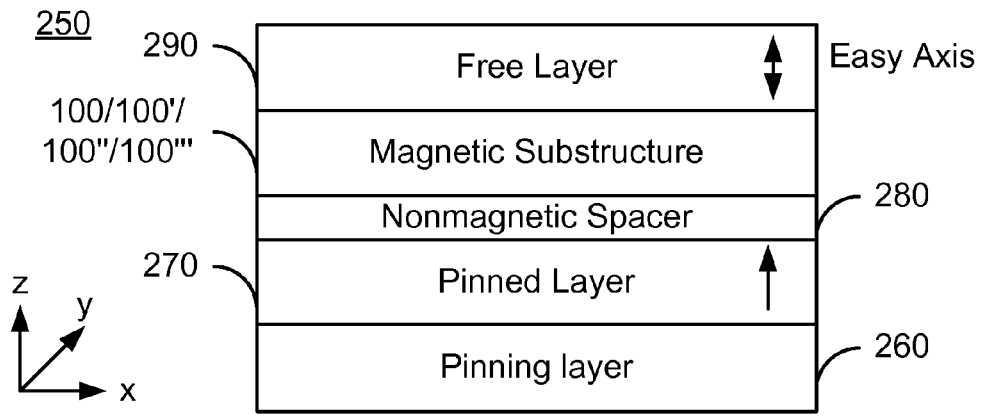
FIG. 10 depicts another exemplary embodiment of a magnetic element utilizing a magnetic substructure.

FIG. 10 depicts an exemplary embodiment of a magnetic element 250 utilizing a magnetic substructure such as the magnetic substructure 100, 100', 100", and/or 100'". For clarity, FIG. 10 is not so scale. The magnetic element 250 may be used in magnetic memory such as an STT-RAM. The magnetic element 250 includes a pinned layer 270, a nonmagnetic spacer layer 280, and a free layer 290. Also shown is optional pinning layer 260, which may be used to fix the magnetization (not shown) of the pinned layer 270. In some embodiments, the optional pinning layer 260 is an AFM layer that pins the magnetization (not shown) of the pinned layer 270 by an exchange-bias interaction. However, in other embodiments, the optional pinning layer 260 may be omitted. Further, the magnetic element 250 may include other and/or additional layers such as seed and/or capping layer(s). The magnetic element 250 is also configured to allow the free layer 290 to be switched between stable magnetic states when a write current is passed through the magnetic element 250. Thus, the free layer 290 is switchable utilizing spin transfer torque.

The spacer layer 280 is nonmagnetic. In some embodiments, the spacer layer 280 is an insulator, for example a tunneling barrier. In such embodiments, the spacer layer 280 may include crystalline MgO, which may enhance the tunneling magnetoresistance (TMR) of the magnetic element. In other embodiments, the spacer layer may be a conductor, such as Cu. In alternate embodiments, the spacer layer 280 might have another structure, for example a granular layer including conductive channels in an insulating matrix.

The pinned layer 270 and the free layer 290 are magnetic and thus may include one or more of Ni, Fe, and Co, particularly in an alloy form. Although depicted as a simple layer, the pinned layer 270 and/or the free layer 290 may include multiple layers. For example, the pinned layer 270 and/or the free layer 290 may be a SAF including magnetic layers antiferromagnetically or ferromagnetically coupled through thin layers, such as Ru. In such a SAF, multiple magnetic layers interleaved with thin layer(s) of Ru or other material may be used. Further, the pinned layer 270 and/or the free layer 290 may include magnetic substructures 100, 100', 100", and/or 100'" (not shown). However, in contrast to the pinned layer 270, the free layer 240 has a changeable magnetization (not shown) that may be switched via spin transfer. In the embodiments shown, the free layer 290 has its easy axis perpendicular to plane (in the z-direction). However, in other embodiments, the free layer 290 may have its easy axis fully or partially in plane. Similarly, the magnetization of the pinned layer 270 is shown as being pinned in the perpendicular direction. However, in other embodiments, the pinned layer 270 magnetization may be in another direction including in plane.

The magnetic element 250 also includes a magnetic substructure such as the magnetic substructure 100, 100', 100", and/or 100'". Thus the magnetic element 250 may include ferromagnetic layers interleaved with nonmagnetic layers with which ferromagnetic layers are immiscible, chemically stable with respect to, and in at least some embodiments is substantially free of an interaction that would produce a magnetically dead layer in the ferromagnetic layers. Further, as described below, a perpendicular anisotropy may be induced in ferromagnetic layers, and thus the free layer 240.

The magnetic substructure 100, 100', 100", and/or 100'" may be used as an interfacial layer between the free layer 290 and the nonmagnetic spacer layer. As such, the free layer 240 may provide a number of benefits. More specifically, the magnetic substructure 100, 100', 100", and/or 100'" may have a perpendicular anisotropy, for example induced by a PPMA within the magnetic substructure 100, 100', 100", and/or 100'". This perpendicular anisotropy may enhance the perpendicular anisotropy of the free layer 290. As a result of the perpendicular anisotropy, the switching current density for spin transfer torque may be reduced for the magnetic element 250. In some embodiments, the magnetic substructure 100, 100', 100", and/or 100'" and the free layer 240 may be at least two nanometers thick. In some such embodiments, the magnetic substructure 100, 100', 100", and/or 100'" and the free layer may be up to four nanometers thick. The magnetic substructure 100, 100', 100", and/or 100'", may be strongly ferromagnetically coupled to the free layer 240. The magnetic substructure 100, 100', 100", and/or 100'", and thus the free layer 240 may be thermally stable at smaller dimensions in-plane.

The materials and layer thicknesses for the magnetic substructure 100, 100', 100", and/or 100'" may also be selected to enhance performance of the magnetic element 250. Materials may be elected to improve the TMR. For example, CoFe, CoFeB (such as $Co_{20}Fe_{60}B_{20}$), and/or like ferromagnetic materials may be used in the magnetic substructure 100, 100', 100", and/or 100'" to provide a microstructure that is consistent with a crystalline MgO nonmagnetic spacer layer 280. Thus, a desired barrier layer may be used for the nonmagnetic spacer layer 280. Because deposition temperatures in excess of four hundred degrees Celsius need not be used to fabricate the magnetic substructure 100, 100', 100", and/or 100'", the desired tunneling barrier layer may survive fabrication of the magnetic element 250. Further, the magnetic substructure 100, 100', 100", and/or 100'" may have a lower moment, which may further reduce the switching current density for the magnetic element 250 as the free layer 290 may be magnetically coupled with the magnetic substructure 100, 100', 100", and/or 100'". The desired configurations of the magnetic substructure 100, 100', 100", and/or 100'" may be achieved using a relatively small number of materials and without high temperature deposition. Moreover, the magnetic substructure 100, 100', 100", and/or 100'" may be configured to have lower damping. In addition, as insulating capping layers, such as MgO may be omitted in favor of using the magnetic substructure 100, 100', 100", and/or 100'", the parasitic resistance of portions of the magnetic element 250 may be reduced. Thus, the performance of the magnetic element 250 may be enhanced through the use of the magnetic substructure 100, 100', 100", and/or 100'". Consequently, the magnetic element 250 using the magnetic substructure 100, 100', 100", and/or 100'" adjacent to the free layer 290 may function as desired for smaller sizes in plane, and thus higher STT-RAM densities.

Figure 11:
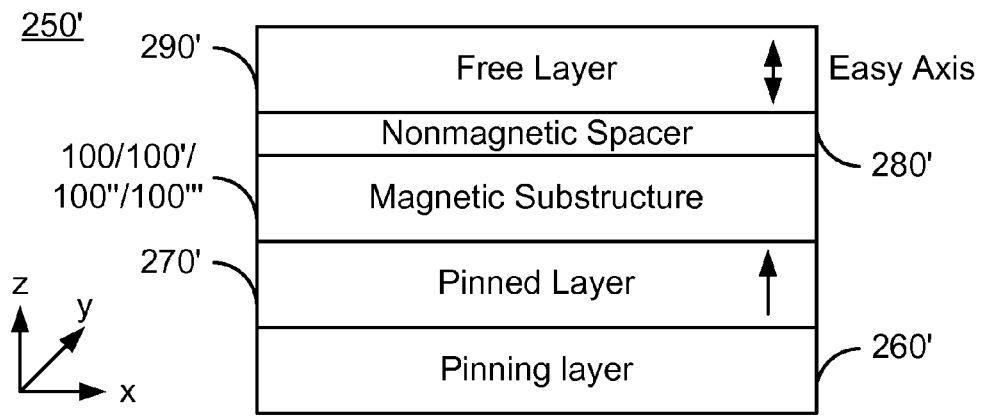
FIG. 11 depicts another exemplary embodiment of a magnetic element utilizing a magnetic substructure.

FIG. 11 depicts an exemplary embodiment of a magnetic element 250' utilizing a magnetic substructure such as the magnetic substructure 100, 100', 100", and/or 100'". For clarity, FIG. 11 is not so scale. The magnetic element 250' may be used in magnetic memory such as an STT-RAM. The magnetic element 250' includes an optional pinning layer 260', a pinned layer 270', a nonmagnetic spacer layer 280', and a free layer 290' analogous to the optional pinning layer 260, the pinned layer 270, the nonmagnetic spacer layer 280, and the free layer 290, respectively. Further, the magnetic element 250' may include other and/or additional layers such as seed and/or capping layer(s). The magnetic element 250' is also configured to allow the free layer 290' to be switched between stable magnetic states when a write current is passed through the magnetic element 250'. Thus, the free layer 290' is switchable utilizing spin transfer torque.

The magnetic element 250' also includes a magnetic substructure such as the magnetic substructure 100, 100', 100", and/or 100'". Thus the magnetic element 250' may include ferromagnetic layers interleaved with nonmagnetic layers with which ferromagnetic layers are immiscible, chemically stable with respect to, and in at least some embodiments is substantially free of an interaction that would produce a magnetically dead layer in the ferromagnetic layers. However, the magnetic substructure 100, 100', 100", and/or 100'" is adjacent to the pinned layer 270' instead of the free layer 290'.

The magnetic substructure 100, 100', 100", and/or 100'" may be used as an interfacial layer between the pinned layer 270' and the nonmagnetic spacer layer 280'. As such, the pinned layer 270' may provide a number of benefits. For example, the magnetic substructure 100, 100', 100", and/or 100'" may have a perpendicular anisotropy, for example induced by a PPMA within the magnetic substructure 100, 100', 100", and/or 100'". This perpendicular anisotropy may enhance the perpendicular anisotropy of the pinned layer 270'. In some embodiments, at least a portion of the pinned layer 270' magnetization may remain in plane. In such embodiments, the out-of-plane demagnetization energy of the pinned layer 270' is not greater than the perpendicular anisotropy energy. In other embodiments, including the embodiment shown in FIG. 11, the pinned layer 270' magnetization may be perpendicular to plane. In such an embodiment, the out-of-plane demagnetization energy is less than the perpendicular anisotropy energy. The pinned layer 270' may thus be better able to function in a perpendicular magnetic element 250'. As a result of the perpendicular anisotropy, the switching current density for spin transfer torque may be reduced for the magnetic element 250'. The materials and layer thicknesses for the magnetic substructure 100, 100', 100", and/or 100'" may also be selected to enhance performance of the magnetic element 250. Materials may be elected to improve the TMR. For example, CoFe, CoFeB, and/or like ferromagnetic materials may be used in the magnetic substructure 100, 100', 100", and/or 100'" to provide a microstructure that is consistent with a crystalline MgO nonmagnetic spacer layer 280'. Thus, a desired barrier layer may be used for the nonmagnetic spacer layer 280'. The desired configurations of the magnetic substructure 100, 100', 100", and/or 100'" may be achieved using a relatively small number of materials and without high temperature deposition. Moreover, the magnetic substructure 100, 100', 100", and/or 100'" may be configured to have lower damping. In addition, as insulating capping layers, such as MgO may be omitted in favor of using the magnetic substructure 100, 100', 100", and/or 100'", the parasitic resistance of portions of the magnetic element 250' may be reduced. Thus, the performance of the magnetic element 250' may be enhanced through the use of the magnetic substructure 100, 100', 100", and/or 100'". Consequently, the magnetic element 250' using the magnetic substructure 100, 100', 100", and/or 100'" adjacent to the pinned 270' may function as desired for smaller sizes in plane, and thus higher STT-RAM densities.

Figure 12:
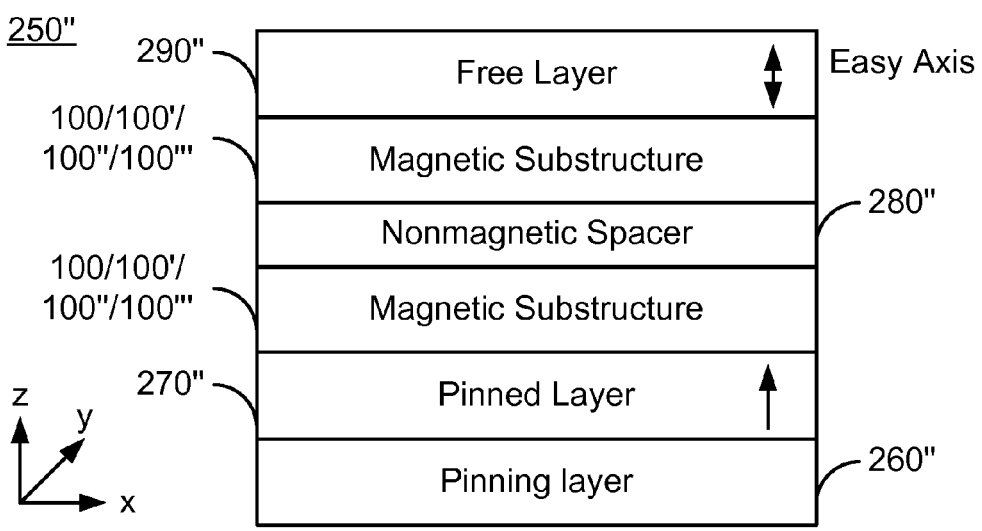
FIG. 12 depicts another exemplary embodiment of a magnetic element utilizing a magnetic substructure.

FIG. 12 depicts an exemplary embodiment of a magnetic element 250" utilizing a magnetic substructure such as the magnetic substructure 100, 100', 100", and/or 100'". For clarity, FIG. 12 is not so scale. The magnetic element 250" may be used in magnetic memory such as an STT-RAM. The magnetic element 250" includes an optional pinning layer 260", a pinned layer 270", a nonmagnetic spacer layer 280", and a free layer 290" analogous to the optional pinning layer 260/260', the pinned layer 270/270', the nonmagnetic spacer layer 280/280', and the free layer 290/290', respectively. Further, the magnetic element 250" may include other and/or additional layers such as seed and/or capping layer(s). The magnetic element 250" is also configured to allow the free layer 290" to be switched between stable magnetic states when a write current is passed through the magnetic element 250". Thus, the free layer 290" is switchable utilizing spin transfer torque.

The magnetic element 250" also includes magnetic substructures such as the magnetic substructure 100, 100', 100", and/or 100'". Thus the magnetic element 250" may include ferromagnetic layers interleaved with nonmagnetic layers with which ferromagnetic layers are immiscible, chemically stable with respect to, and in at least some embodiments is substantially free of an interaction that would produce a magnetically dead layer in the ferromagnetic layers. A first magnetic substructure 100, 100', 100", and/or 100'" is adjacent to the pinned layer 270", while a second magnetic substructure 100, 100', 100", and/or 100'" is adjacent to the free layer 290". The magnetic substructures 100, 100', 100", and/or 100'" may be used as interfacial layers between the pinned layer 270" and the nonmagnetic spacer layer 280" and between the free layer 290" and the nonmagnetic spacer layer 280". As such, the benefits of the magnetic elements 250 and/or 250' may be achieved.

Figure 13:
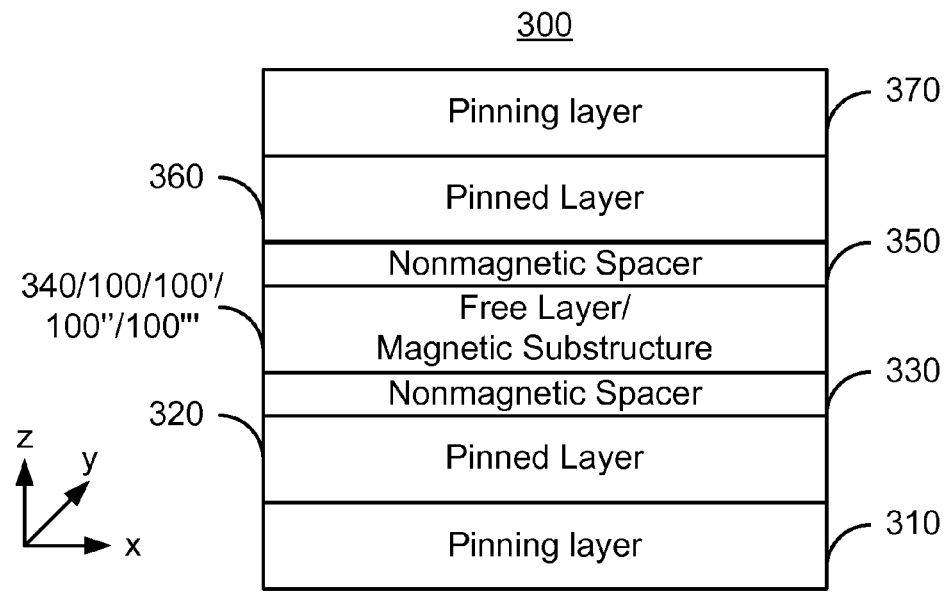
FIG. 13 depicts another exemplary embodiment of a magnetic element utilizing a magnetic substructure.

FIG. 13 depicts an exemplary embodiment of a magnetic element 300 utilizing a magnetic substructure such as the magnetic substructure 100, 100', 100", and/or 100'". For clarity, FIG. 13 is not so scale. The magnetic element 300 may be used in magnetic memory such as an STT-RAM. The magnetic element 300 includes a first pinned layer 320, a first nonmagnetic spacer layer 330, a free layer 340, a second nonmagnetic spacer layer 350, and a second pinned layer 360. Also shown are optional pinning layers 310 and 370, which may be used to fix the magnetizations (not shown) of the pinned layer 320 and 360, respectively. In some embodiments, the optional pinning layers 310 and 370 are AFM layers that pin the magnetization (not shown) of the pinned layers 320 and 360 by an exchange-bias interaction. However, in other embodiments, the optional pinning layers 320 and/or 370 may be omitted. Further, the magnetic element 300 may include other and/or additional layers such as seed and/or capping layer(s). The magnetic element 300 is also configured to allow the free layer 340 to be switched between stable magnetic states when a write current is passed through the magnetic element 300. Thus, the free layer 340 is switchable utilizing spin transfer torque.

The spacer layers 330 and 350 are nonmagnetic. In some embodiments, the spacer layer 330 is an insulator, for example a tunneling barrier. In such embodiments, the spacer layers 330 and/or 350 may include crystalline MgO, which may enhance the tunneling magnetoresistance (TMR) of the magnetic element. In other embodiments, the spacer layers 330 and/or 350 may be conductors, such as Cu. In alternate embodiments, the spacer layers 330 and/or 350 might have another structure, for example a granular layer including conductive channels in an insulating matrix. In some embodiments, both the spacer layers 330 and 350 are insulating tunneling barriers. However, in other embodiments, only one spacer layer 330 or 350 is an insulating tunneling barrier. The other spacer layer 350 or 330, respectively, may be conductive.

The pinned layers 320 and 360 and the free layer 340 are magnetic and thus may include one or more of Ni, Fe, and Co, particularly in an alloy form. Although depicted as a simple layer, the pinned layers 320 and 360 may include multiple layers. For example, one or more of the pinned layers 320 and 360 may be a SAF including magnetic layers antiferromagnetically or ferromagnetically coupled through thin layers, such as Ru. In such a SAF, multiple magnetic layers interleaved with thin layer(s) of Ru or other material may be used. The magnetization of the pinned layers 320 and 370 may be in the perpendicular direction. However, in other embodiments, the pinned layer 320 and 370 magnetizations may be in another direction including partially or completely in plane.

Further, the free layer 340 may include magnetic substructures 100, 100', 100", and/or 100'" (not separately shown). The free layer 340 also has a changeable magnetization (not shown) that may be switched via spin transfer. The free layer 340 may have its easy axis perpendicular to plane (in the z-direction). However, in other embodiments, the free layer 340 may have its easy axis fully or partially in plane. The free layer 340 may consist of the magnetic substructures 100, 100', 100", and/or 100'" or may also include other layers. Thus, the free layer 340 may be analogous to the free layer 240. Thus, benefits analogous to those achieved for the magnetic element 200 may be achieved for the magnetic element 300. In addition, the benefits of a dual magnetic structure, such as a dual magnetic tunneling junction or a single barrier magnetic tunneling junction, in which one nonmagnetic spacer layer is a barrier layer and the other is conductive, may be achieved.

Figure 14:
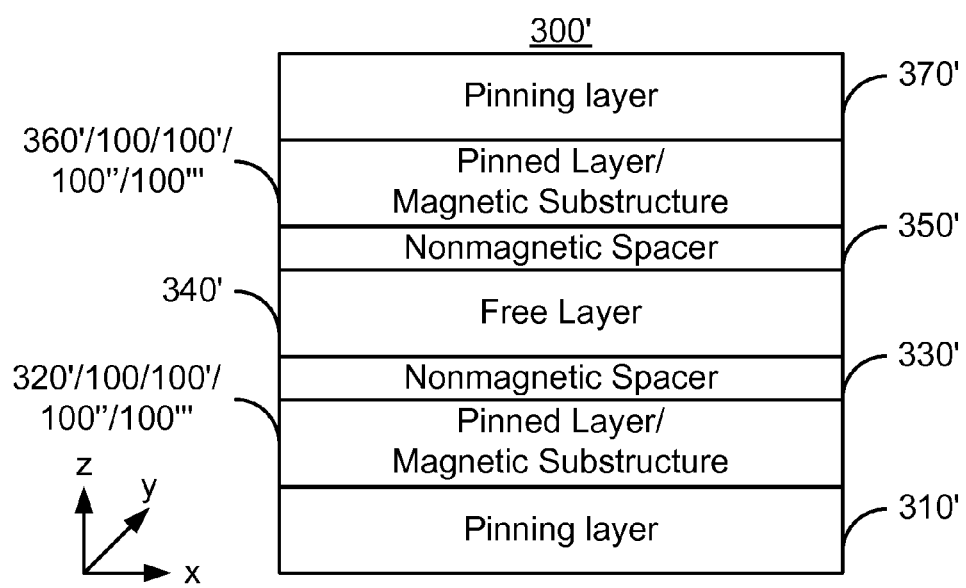
FIG. 14 depicts another exemplary embodiment of a magnetic element utilizing a magnetic substructure.

FIG. 14 depicts an exemplary embodiment of a magnetic element 300' utilizing a magnetic substructure such as the magnetic substructure 100, 100', 100", and/or 100'". For clarity, FIG. 14 is not so scale. The magnetic element 300' may be used in magnetic memory such as an STT-RAM. The magnetic element 300' is analogous to the magnetic element 300. The magnetic element 300' thus includes a first pinned layer 320', a first nonmagnetic spacer layer 330', a free layer 340', a second nonmagnetic spacer layer 350', and a second pinned layer 360' analogous to the first pinned layer 320, the first nonmagnetic spacer layer 330, the free layer 340, the second nonmagnetic spacer layer 350, and the second pinned layer 360, respectively. Also shown are optional pinning layers 310' and 370' which are analogous to the optional pinning layers 310 and 370, respectively. However, in other embodiments, the optional pinning layers 320' and/or 370' may be omitted. Further, the magnetic element 300' may include other and/or additional layers such as seed and/or capping layer(s). The magnetic element 300' is also configured to allow the free layer 340' to be switched between stable magnetic states when a write current is passed through the magnetic element 300'. Thus, the free layer 340' is switchable utilizing spin transfer torque.

In contrast to the magnetic element 300, the free layer 340' may not include magnetic substructures 100, 100', 100", and/or 100'". However, the free layer 390' may include multiple layers. For example, the free layer 340' may be a SAF including magnetic layers antiferromagnetically or ferromagnetically coupled through thin layers, such as Ru. In such a SAF, multiple magnetic layers interleaved with thin layer(s) of Ru or other material may be used. The magnetization of the free layer 340' may be in the perpendicular direction. However, in other embodiments, the free layer 340' magnetization may be in another direction including partially or completely in plane.

The pinned layer 320' and/or the pinned layer 360' may include magnetic substructures 100, 100', 100", and/or 100'" (not separately shown). The pinned layer 320' and/or the pinned layer 360' may have their easy axes perpendicular to plane (in the z-direction). However, in other embodiments, the pinned layer 320' and/or the pinned layer 360' may have their easy axes fully or partially in plane. The pinned layer 320' and/or the pinned layer 360' may consist of the magnetic substructures 100, 100', 100", and/or 100'" or may also include other layers. Thus, the pinned layer 320' and/or the pinned layer 360' may be analogous to the pinned layer 220' or 220". Thus, benefits analogous to those achieved for the magnetic element 200' and/or 200" may be achieved for the magnetic element 300'. In addition, the benefits of a dual magnetic structure, such as a dual magnetic tunneling junction or a single barrier magnetic tunneling junction, in which one nonmagnetic spacer layer is a barrier layer and the other is conductive, may be achieved.

Figure 15:
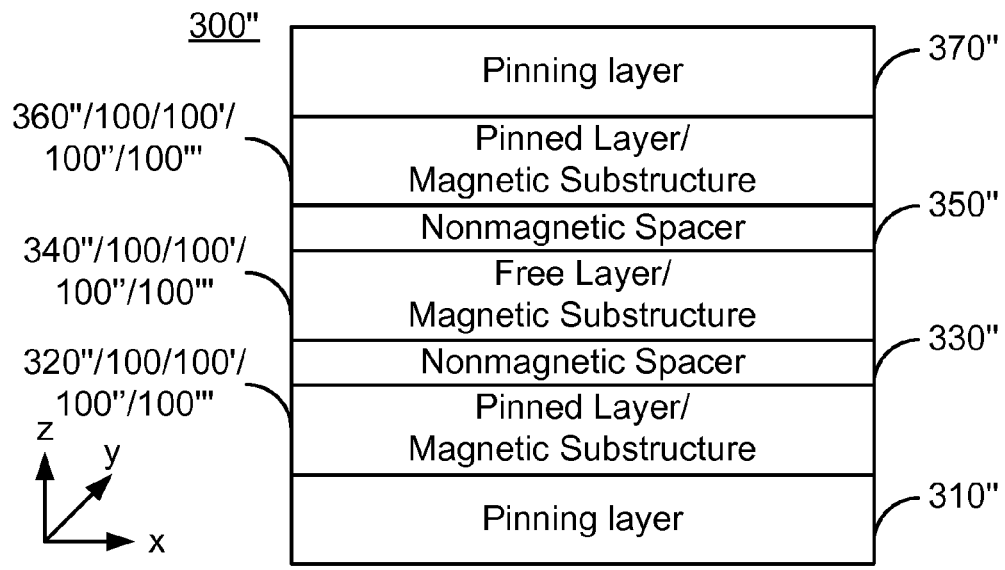
FIG. 15 depicts another exemplary embodiment of a magnetic element utilizing a magnetic substructure.

FIG. 15 depicts an exemplary embodiment of a magnetic element 300" utilizing a magnetic substructure such as the magnetic substructure 100, 100', 100", and/or 100'". For clarity, FIG. 15 is not so scale. The magnetic element 300" may be used in magnetic memory such as an STT-RAM. The magnetic element 300' is analogous to the magnetic elements 300 and 300'. The magnetic element 300" thus includes a first pinned layer 320", a first nonmagnetic spacer layer 330", a free layer 340", a second nonmagnetic spacer layer 350", and a second pinned layer 360" analogous to the first pinned layer 320/320', the first nonmagnetic spacer layer 330/330', the free layer 340/340', the second nonmagnetic spacer layer 350/350', and the second pinned layer 360/360', respectively. Also shown are optional pinning layers 310" and 370" which are analogous to the optional pinning layers 310/310' and 370/370', respectively. However, in other embodiments, the optional pinning layers 310" and/or 370" may be omitted. Further, the magnetic element 300" may include other and/or additional layers such as seed and/or capping layer(s). The magnetic element 300" is also configured to allow the free layer 340" to be switched between stable magnetic states when a write current is passed through the magnetic element 300". Thus, the free layer 340" is switchable utilizing spin transfer torque.

The free layer 340" as well as one or more of the pinned layers 320" and/or 360" may include magnetic substructures 100, 100', 100", and/or 100'" (not separately shown). The free layer 340", the pinned layer 320" and/or the pinned layer 360" may have their easy axes perpendicular to plane (in the z-direction). However, in other embodiments, the free layer 340", the pinned layer 320" and/or the pinned layer 360" may have their easy axes fully or partially in plane. The free layer 340", the pinned layer 320" and/or the pinned layer 360" may consist of the magnetic substructures 100, 100', 100", and/or 100'" or may also include other layers. Thus, the free layer 340", the pinned layer 320" and/or the pinned layer 360" may be analogous to the free layer 240/240'" and/or the pinned layer 220'/220"/220'". Thus, benefits analogous to those achieved for the magnetic element 200, 200', 200", and/or 200'" may be achieved for the magnetic element 300". In addition, the benefits of a dual magnetic structure, such as a dual magnetic tunneling junction or a single barrier magnetic tunneling junction, in which one nonmagnetic spacer layer is a barrier layer and the other is conductive, may be achieved.

Figure 16:
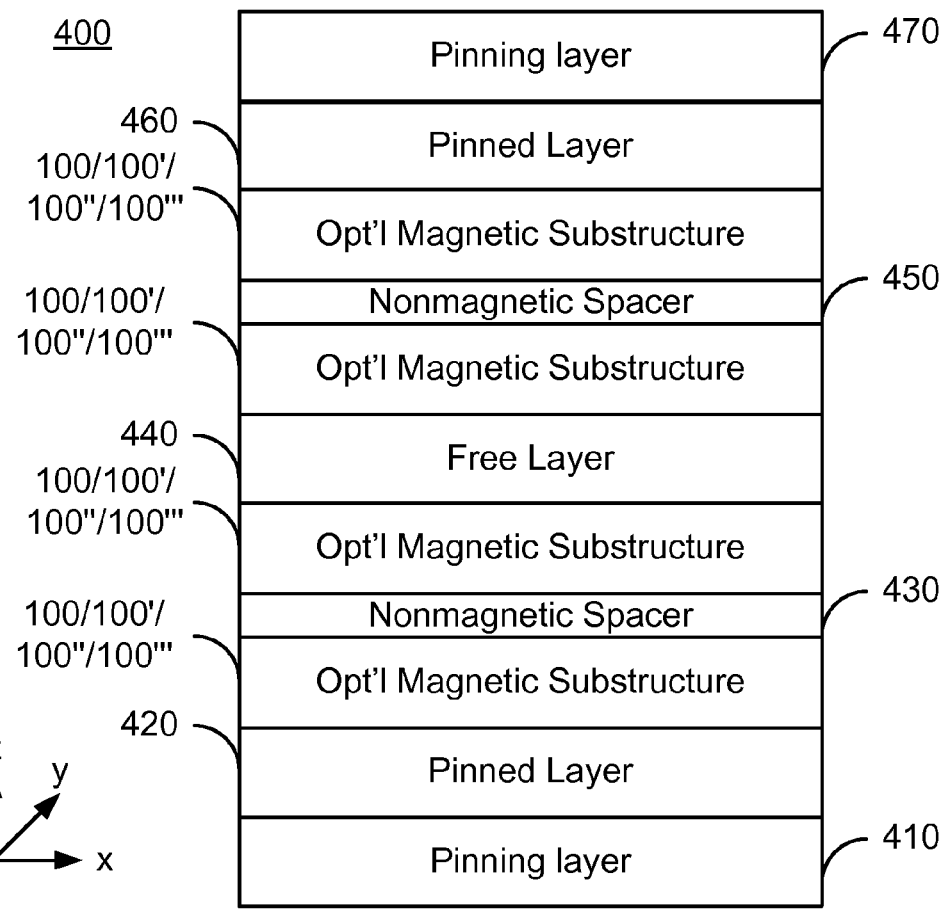
FIG. 16 depicts another exemplary embodiment of a magnetic element utilizing a magnetic substructure.

FIG. 16 depicts another exemplary embodiment of a magnetic element 400 utilizing a magnetic substructure, such as the magnetic substructure 100,100', 100", and/or 100'". For clarity, FIG. 16 is not so scale. The magnetic element 400 may be used in magnetic memory such as an STT-RAM. The magnetic element 400 includes a first pinned layer 420, a first nonmagnetic spacer layer 430, a free layer 440, a second nonmagnetic spacer layer 450, and a second pinned layer 460. Also shown are optional pinning layers 410 and 470, which may be used to fix the magnetizations (not shown) of the pinned layer 420 and 460, respectively. In some embodiments, the optional pinning layers 410 and 470 are AFM layers that pin the magnetization (not shown) of the pinned layers 420 and 460 by an exchange-bias interaction. However, in other embodiments, the optional pinning layers 420 and/or 470 may be omitted. Further, the magnetic element 300 may include other and/or additional layers such as seed and/or capping layer(s). The magnetic element 400 is also configured to allow the free layer 440 to be switched between stable magnetic states when a write current is passed through the magnetic element 400. Thus, the free layer 440 is switchable utilizing spin transfer torque.

The spacer layers 430 and 450 are nonmagnetic. In some embodiments, the spacer layer 430 is an insulator, for example a tunneling barrier. In such embodiments, the spacer layers 430 and/or 450 may include crystalline MgO, which may enhance the tunneling magnetoresistance (TMR) of the magnetic element. In other embodiments, the spacer layers 430 and/or 450 may be conductors, such as Cu. In alternate embodiments, the spacer layers 430 and/or 450 might have another structure, for example a granular layer including conductive channels in an insulating matrix. In some embodiments, both the spacer layers 430 and 450 are insulating tunneling barriers. However, in other embodiments, only one spacer layer 430 or 450 is an insulating tunneling barrier. The other spacer layer 450 or 430, respectively, may be conductive.

The pinned layers 420 and 460 and the free layer 440 are magnetic and thus may include one or more of Ni, Fe, and Co, particularly in an alloy form. Although depicted as simple layers, the layers 420, 460, and/or 440 may include multiple layers. For example, one or more of the layers 420, 460, and/or 440 may be a SAF including magnetic layers antiferromagnetically or ferromagnetically coupled through thin layers, such as Ru. In such a SAF, multiple magnetic layers interleaved with thin layer(s) of Ru or other material may be used. The magnetization of the layers 420, 460, and/or 440 may be in the perpendicular direction. However, in other embodiments, the layers 420, 460, and/or 440 magnetizations may be in another direction including partially or completely in plane. Further, although shown as simple layers, one or more of the free layer 440, the pinned layer 420, and/or the pinned layer 460 may include magnetic substructures 100, 100', 100", and/or 100''' (not separately shown). The free layer 440, pinned layer 420, and/or the pinned layer 460 may consist of the magnetic substructures 100, 100', 100", and/or 100''' or may also include other layers. The free layer 440 also has a changeable magnetization (not shown) that may be switched via spin transfer. The free layer 440 may have its easy axis perpendicular to plane (in the z-direction). However, in other embodiments, the free layer 440 may have its easy axis fully or partially in plane. Similarly, the pinned layers 420 and/or 460 may have their easy axes perpendicular to plane (in the z-direction). However, in other embodiments, the 420 and/or 460 may have its easy axis fully or partially in plane.

The magnetic element 400 also includes one or more optional magnetic substructures 100/100'/100"/100'''. Such optional magnetic substructures 100/100'/100"/100''' may reside at one or more of the following locations: between the nonmagnetic spacer layer 430 and the pinned layer 420, between the free layer 440 and nonmagnetic spacer layer 430, between the free layer 440 and the nonmagnetic spacer 450, and/or between the pinned layer 460 and the nonmagnetic spacer layer 450. Thus, the magnetic element 400 may be analogous to one or more of the magnetic elements 250, 250', and/or 250". Thus, benefits analogous to those achieved for the magnetic element 400 may be achieved for the magnetic elements 250, 250', and/or 250". In addition, the benefits of a dual magnetic structure, such as a dual magnetic tunneling junction or a single barrier magnetic tunneling junction, in which one nonmagnetic spacer layer is a barrier layer and the other is conductive, may be achieved.

Various magnetic elements 200, 200', 200", 200''', 205, 250', 250", 300, 300', 300", and 400 utilizing the magnetic substructures 100, 100', 100", and/or 100''' have been disclosed. Note that various features of the magnetic elements 200, 200', 200", 200''', 205, 250', 250", 300, 300', 300", and 400 may be combined. Similarly, some or all of the features of the magnetic substructures 100, 100', 100", and/or 100''' may be combined. Thus, one or more of the benefits of the magnetic substructures 100, 100', 100", and/or 100''' such as a perpendicular anisotropy even at large thicknesses, thermal stability, higher magnetoresistance, a magnetic moment that can be tailored, a magnetic interaction that may be tailored, a reduced parasitic resistance, lower write current density for spin transfer, and/or lower damping may be achieved.

Figure 17:
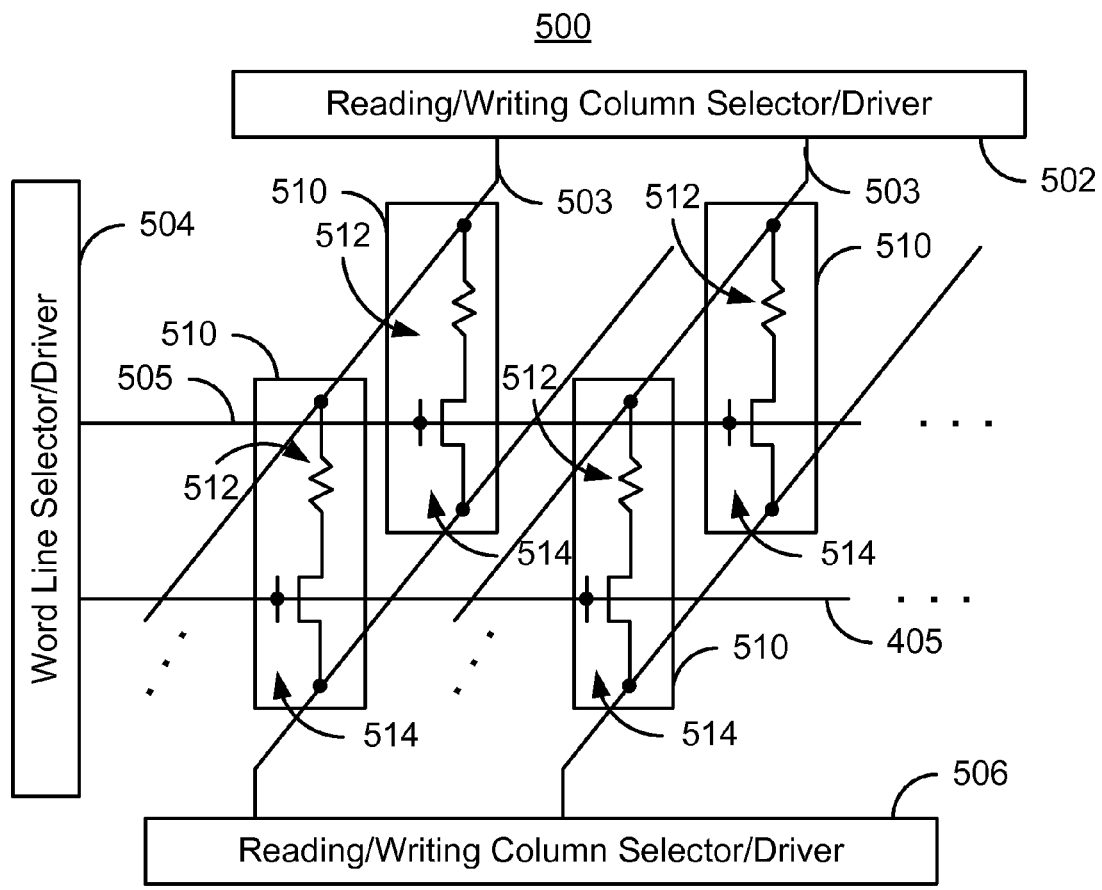
FIG. 17 depicts an exemplary embodiment of a memory utilizing a magnetic substructure in the memory element(s) of the storage cell(s).
Figure 18:
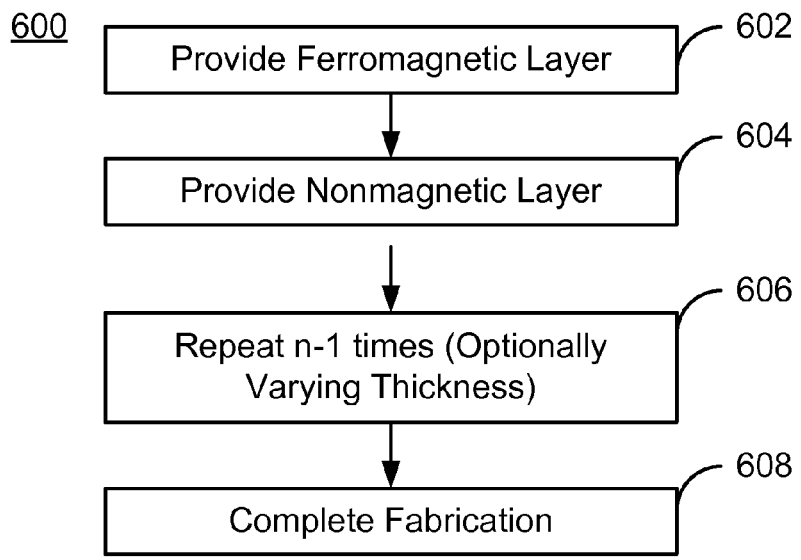
FIG. 18 depicts an exemplary embodiment of a method for fabricating magnetic substructure.

Further, the magnetic elements using magnetic substructures such as the substructures 100, 100', 100", and/or 100''' may be used in a magnetic memory. FIG. 17 depicts an exemplary embodiment of one such memory 500. The magnetic memory 500 includes reading/writing column select drivers 502 and 506 as well as word line select driver 504. Note that other and/or different components may be provided. The storage region of the memory 500 includes magnetic storage cells 510. Each magnetic storage cell includes at least one magnetic element 512 and at least one selection device 514. In some embodiments, the selection device 514 is a transistor. The magnetic elements 512 include the magnetic substructure 100, 100', 100" and/or 100'''. Thus, the magnetic element 512 may be magnetic elements 200, 200', 200", 200''', 205, 250', 250", 300, 300', 300", 400 or some combination thereof. As such, the magnetic memory 500 may enjoy the benefits described above, such as thermal stability and a low write current density, FIG. 18 depicts an exemplary embodiment of a method 600 for fabricating magnetic substructure. For simplicity, some steps may be omitted or combined. The method 600 is described in the context of the magnetic substructure 100. However, the method 600 may be used on other magnetic substructures such as the substructures 100', 100", and 100'''. Further, the method 600 may be incorporated into fabrication of magnetic elements, such as the magnetic elements 200, 200', 200", 200''', 205, 250', 250", 300, 300', 300", 400, and/or 512. Thus the method 600 may be used in manufacturing a STT-RAM or other magnetic memory. The method 600 may commence after the underlying nonmagnetic layer 101 is provided if desired.

The ferromagnetic layer 102 is provided, via step 602. Step 602 may include depositing the desired materials, such as an alloy including CoFeB, to the desired thickness of the ferromagnetic layer 102. In other embodiments, portions of the ferromagnetic layer 102 may be removed to achieve the desired thickness. In some embodiments, the ferromagnetic layer may be blanket deposited. In others, photolithography may limit the deposition of the ferromagnetic layer to certain regions. The nonmagnetic layer 104 is provided, via step 604. Step 604 may include depositing the desired nonmagnetic materials, including but not limited Cr and V. Addition, the desired thickness of material may be deposited in step 602. In some embodiments, the nonmagnetic layer 104 may be blanket deposited. In others, photolithography ay limit the deposition of the nonmagnetic layer to certain regions. This formation of the ferromagnetic-nonmagnetic bilayer is repeated n−1 times, so that the structure being formed includes n repeats of the bilayer. Thus, the magnetic substructure 100, 100', 100", and/or 100''' is formed. Fabrication of the magnetic structure 100, 100', 100", and/or 100''' may then be completed, via step 608. For example, the magnetic element in which the magnetic substructure 100, 100', 100", and/or 100''' is used may be defined. Using the method 600, therefore, the magnetic element 100, 100', 100", and/or 100''' may be fabricated. Consequently, the benefits of the magnetic element may be achieved.

A method and system for providing a magnetic substructure, a magnetic memory element using the magnetic substructure, and a memory fabricated using the magnetic memory element/magnetic substructure has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic substructure for use in a magnetic device, the magnetic substructure comprising:
    a plurality of ferromagnetic layers;
    a plurality of nonmagnetic layers, the plurality of ferromagnetic layers being interleaved with the plurality of nonmagnetic layers, the plurality of ferromagnetic layers being immiscible with the plurality of nonmagnetic layers and chemically stable with respect to the plurality of nonmagnetic layers, the plurality of ferromagnetic layers also being substantially free of a magnetically dead layer-producing interaction with the plurality of nonmagnetic layers, the plurality of nonmagnetic layers inducing a perpendicular anisotropy in the plurality of ferromagnetic layers, the perpendicular anisotropy corresponding to a perpendicular anisotropy energy and wherein the magnetic substructure has an out-of-plane demagnetization energy, the perpendicular anisotropy energy being greater than the out-of-plane demagnetization energy; and
    wherein the magnetic substructure is configured to be switchable between a plurality of stable magnetic states when a write current is passed through the magnetic substructure.

2. The magnetic substructure of claim 1 wherein the plurality of nonmagnetic layers include at least one of Al, AlN, aluminum oxide, Au, Cr, crystalline MgO, Cu, doped MgO, indium tin oxide, Mg, Mo, NiO, Pd, Pt, Ru, RuO2, silicon oxide, SiN, Ta, TaN, Ti, TiN, V, W, Y.

3. The magnetic substructure of claim 2 wherein the plurality of nonmagnetic layers include at least one oxide.

4. The magnetic substructure of claim 1 wherein the plurality of ferromagnetic layers includes at least one of Ni, Co, and Fe.

5. The magnetic substructure of claim 4 wherein the plurality of ferromagnetic layers includes at least one oxide.

6. The magnetic substructure of claim 1 wherein the plurality of ferromagnetic layers include at least one of CoFe and CoFeB and wherein the plurality of nonmagnetic layers include at least one of Cr and V and wherein the substructure has a magnetization of at least one hundred and not more than one thousand three hundred emu/cc.

7. The magnetic substructure of claim 1 wherein each of the plurality of magnetic layers has a substantially equal thickness.

8. The magnetic substructure of claim 1 wherein at least a portion of the plurality of magnetic layers have different thicknesses.

9. The magnetic substructure of claim 1 wherein each of the plurality of nonmagnetic layers has a substantially equal thickness.

10. The magnetic substructure of claim 1 wherein at least a portion of the plurality of nonmagnetic layers have different thicknesses.

11. The magnetic substructure of claim 1 wherein each of the plurality of nonmagnetic layers has a single composition.

12. The magnetic substructure of claim 1 wherein at least a portion of the plurality of nonmagnetic layers have different compositions.

13. The magnetic substructure of claim 12 wherein the each of the plurality of ferromagnetic layers is at least three times thicker than the adjoining nonmagnetic layer of the plurality of nonmagnetic layers.

14. The magnetic substructure of claim 1 wherein at least a portion of the plurality of nonmagnetic layers are discontinuous.

15. The magnetic substructure of claim 1 wherein each of the plurality of ferromagnetic layers is thicker than an adjoining nonmagnetic layer of the plurality of nonmagnetic layers.

16. The magnetic substructure of claim 1 wherein the substructure has a total thickness of at least two and not more than four nanometers.

17. The magnetic substructure of claim 16 wherein the total thickness is at least three nanometers.

18. The magnetic substructure of claim 1 wherein the plurality of nonmagnetic layers are configured such that the plurality of ferromagnetic layers is ferromagnetically coupled through the plurality of nonmagnetic layers.

19. The magnetic substructure of claim 1 wherein the plurality of nonmagnetic layers are configured such that the plurality of ferromagnetic layers is antiferromagnetically coupled through the plurality of nonmagnetic layers.

20. The magnetic substructure of claim 1 wherein the plurality of nonmagnetic layers is configured such that the plurality of ferromagnetic layers has a substantially zero interlayer exchange coupling such that the plurality of ferromagnetic layers are dipole coupled.

21. The magnetic substructure of claim 1 wherein the plurality of nonmagnetic layers are configured such that a first portion of the plurality of ferromagnetic layers are ferromagnetically coupled through the plurality of nonmagnetic layers and a second portion of the plurality of ferromagnetic layers are antiferromagnetically coupled through the plurality of nonmagnetic layers.

22. A magnetic element for use in a magnetic device, the magnetic substructure comprising:
    a pinned layer;
    a nonmagnetic spacer layer; and
    a free layer, the nonmagnetic spacer layer residing between the free layer and the pinned layer;
    wherein the magnetic element includes at least one magnetic substructure, each of the at least one magnetic substructure including a plurality of ferromagnetic layers and a plurality of nonmagnetic layers, the plurality of ferromagnetic layers being interleaved with the plurality of nonmagnetic layers, the plurality of ferromagnetic layers being immiscible with the plurality of nonmagnetic layers and chemically stable with respect to the plurality of nonmagnetic layers, the plurality of ferromagnetic layers also being substantially free of a magnetically dead layer-producing interaction with the plurality of nonmagnetic layers, the plurality of nonmagnetic layers inducing a perpendicular anisotropy in the plurality of ferromagnetic layers, the perpendicular anisotropy corresponding to a perpendicular anisotropy energy, the magnetic substructure having an out-of-plane demagnetization energy, the perpendicular anisotropy energy being greater than the out-of-plane demagnetization energy; and wherein the magnetic element is configured to allow the free layer to be switched between a plurality of stable magnetic states when a write current is passed through the magnetic element.

23. The magnetic element of claim 22 wherein at least one of the free layer and the pinned layer includes a magnetic substructure of the at least one magnetic substructure.

24. The magnetic element of claim 22 wherein a magnetic substructure of the at least one magnetic substructure resides between the nonmagnetic spacer layer and the free layer.

25. The magnetic element of claim 22 wherein a magnetic substructure of the magnetic element resides between the nonmagnetic spacer layer and the pinned layer.

26. The magnetic element of claim 22 further comprising:
an additional spacer layer; and
an additional pinned layer, the additional spacer layer residing between the free layer and the additional pinned layer.

27. The magnetic element of claim 26 wherein at least one of the free layer, the pinned layer, and the additional pinned layer includes a magnetic substructure of the at least one magnetic substructure.

28. The magnetic element of claim 26 wherein at least one of the additional spacer layer and the spacer layer is an insulating tunneling barrier layer.

29. A magnetic memory comprising:
a plurality of magnetic storage cells, each of the plurality of magnetic storage cells including at least one magnetic element, the at least one magnetic element including a pinned layer, a nonmagnetic spacer layer, and a free layer, the nonmagnetic spacer layer residing between the free layer and the pinned layer, the magnetic element including at least one magnetic substructure, each of the at least one magnetic substructure including a plurality of ferromagnetic layers and a plurality of nonmagnetic layers, the plurality of ferromagnetic layers being interleaved with the plurality of nonmagnetic layers, the plurality of ferromagnetic layers being immiscible with the plurality of nonmagnetic layers and chemically stable with respect to the plurality of nonmagnetic layers, the plurality of ferromagnetic layers also being substantially free of a magnetically dead layer-producing interaction with the plurality of nonmagnetic layers, the plurality of nonmagnetic layers inducing a perpendicular anisotropy in the plurality of ferromagnetic layers, the free layer having an out-of-plane demagnetization energy and a perpendicular anisotropy energy greater than the out-of-plane demagnetization energy;
the at least one magnetic element being configured to allow the free layer to be switched between a plurality of stable magnetic states when a write current is passed through the magnetic element.

30. The magnetic memory of claim 29 wherein at least one of the free layer and the pinned layer includes a magnetic substructure of the at least one magnetic substructure.

31. The magnetic memory of claim 29 wherein a magnetic substructure of the at least one magnetic substructure resides between the nonmagnetic spacer layer and the free layer.

32. The magnetic memory of claim 29 wherein a magnetic substructure of the magnetic substructure resides between the nonmagnetic spacer layer and the pinned layer.

33. A magnetic element for use in a magnetic device, the magnetic substructure comprising:

a pinned layer;
a nonmagnetic spacer layer; and
a free layer, the nonmagnetic spacer layer residing between the free layer and the pinned layer, wherein the free layer has an out-of-plane demagnetization energy and a perpendicular anisotropy energy greater than the out-of-plane demagnetization energy; and wherein the magnetic element includes at least one magnetic substructure, each of the at least one magnetic substructure including a plurality of ferromagnetic layers and a plurality of nonmagnetic layers, the plurality of ferromagnetic layers being interleaved with the plurality of nonmagnetic layers, the plurality of ferromagnetic layers being immiscible with the plurality of nonmagnetic layers and chemically stable with respect to the plurality of nonmagnetic layers, the plurality of ferromagnetic layers also being substantially free of a magnetically dead layer-producing interaction with the plurality of nonmagnetic layers, the plurality of nonmagnetic layers inducing a perpendicular anisotropy in the plurality of ferromagnetic layers;

wherein a magnetic substructure of the at least one magnetic substructure resides between the nonmagnetic spacer layer and the free layer; and wherein the magnetic element is configured to allow the free layer to be switched between a plurality of stable magnetic states when a write current is passed through the magnetic element.

34. A magnetic element for use in a magnetic device, the magnetic substructure comprising:
a pinned layer;
a nonmagnetic spacer layer; and
a free layer, the nonmagnetic spacer layer residing between the free layer and the pinned layer, wherein the free layer has an out-of-plane demagnetization energy and a perpendicular anisotropy energy less than the out-of-plane demagnetization energy;

wherein the magnetic element includes at least one magnetic substructure, each of the at least one magnetic substructure including a plurality of ferromagnetic layers and a plurality of nonmagnetic layers, the plurality of ferromagnetic layers being interleaved with the plurality of nonmagnetic layers, the plurality of ferromagnetic layers being immiscible with the plurality of nonmagnetic layers and chemically stable with respect to the plurality of nonmagnetic layers, the plurality of ferromagnetic layers also being substantially free of a magnetically dead layer-producing interaction with the plurality of nonmagnetic layers, the plurality of nonmagnetic layers inducing a perpendicular anisotropy in the plurality of ferromagnetic layers; and wherein the magnetic element is configured to allow the free layer to be switched between a plurality of stable magnetic states when a write current is passed through the magnetic element.

35. A magnetic element for use in a magnetic device, the magnetic substructure comprising:
a pinned layer, wherein the pinned layer has an out-of-plane demagnetization energy and a perpendicular anisotropy energy greater than the out-of-plane demagnetization energy;
a nonmagnetic spacer layer; and
a free layer, the nonmagnetic spacer layer residing between the free layer and the pinned layer;
wherein the magnetic element includes at least one magnetic substructure, each of the at least one magnetic substructure including a plurality of ferromagnetic layers and a plurality of nonmagnetic layers, the plurality of ferromagnetic layers being interleaved with the plurality of nonmagnetic layers, the plurality of ferromagnetic layers being immiscible with the plurality of nonmagnetic layers and chemically stable with respect to the plurality of nonmagnetic layers, the plurality of ferromagnetic layers also being substantially free of a magnetically dead layer-producing interaction with the plurality of nonmagnetic layers, the plurality of nonmagnetic layers inducing a perpendicular anisotropy in the plurality of ferromagnetic layers, a magnetic substructure of the magnetic element resides between the nonmagnetic spacer layer and the pinned layer; and wherein the magnetic element is configured to allow the free layer to be switched between a plurality of stable magnetic states when a write current is passed through the magnetic element.

36. A magnetic element for use in a magnetic device, the magnetic substructure comprising:

a pinned layer, the pinned layer having an out-of-plane demagnetization energy and a perpendicular anisotropy energy less than the out-of-plane demagnetization energy;

a nonmagnetic spacer layer; and a free layer, the nonmagnetic spacer layer residing between the free layer and the pinned layer;

wherein the magnetic element includes at least one magnetic substructure, each of the at least one magnetic substructure including a plurality of ferromagnetic layers and a plurality of nonmagnetic layers, the plurality of ferromagnetic layers being interleaved with the plurality of nonmagnetic layers, the plurality of ferromagnetic layers being immiscible with the plurality of nonmagnetic layers and chemically stable with respect to the plurality of nonmagnetic layers, the plurality of ferromagnetic layers also being substantially free of a magnetically dead layer-producing interaction with the plurality of nonmagnetic layers, the plurality of nonmagnetic layers inducing a perpendicular anisotropy in the plurality of ferromagnetic layers, a magnetic substructure of the magnetic element resides between the nonmagnetic spacer layer and the pinned layer; and wherein the magnetic element is configured to allow the free layer to be switched between a plurality of stable magnetic states when a write current is passed through the magnetic element.

37. A magnetic memory comprising:

a plurality of magnetic storage cells, each of the plurality of magnetic storage cells including at least one magnetic element, the at least one magnetic element including a pinned layer, a nonmagnetic spacer layer, a free layer, an additional spacer layer and an additional pinned layer, the additional spacer layer residing between the free layer and the additional pinned layer, the nonmagnetic spacer layer residing between the free layer and the pinned layer, the magnetic element including at least one magnetic substructure, each of the at least one magnetic substructure including a plurality of ferromagnetic layers and a plurality of nonmagnetic layers, the plurality of ferromagnetic layers being interleaved with the plurality of nonmagnetic layers, the plurality of ferromagnetic layers being immiscible with the plurality of nonmagnetic layers and chemically stable with respect to the plurality of nonmagnetic layers, the plurality of ferromagnetic layers also being substantially free of a magnetically dead layer-producing interaction with the plurality of nonmagnetic layers, the plurality of nonmagnetic layers inducing a perpendicular anisotropy in the plurality of ferromagnetic layers;

the at least one magnetic element being configured to allow the free layer to be switched between a plurality of stable magnetic states when a write current is passed through the magnetic element.

* * * * *